United States Patent
Seesselberg et al.

(10) Patent No.: US 11,249,294 B2
(45) Date of Patent: Feb. 15, 2022

(54) OPTICAL SYSTEM AND METHOD FOR CORRECTING MASK DEFECTS USING THE SYSTEM

(71) Applicants: Carl Zeiss SMT GmbH, Oberkochen (DE); Carl Zeiss SMS Ltd., D.N. Misgav (IL)

(72) Inventors: Markus Seesselberg, Aalen (DE); Vladimir Dmitriev, Tzurit (IL); Joachim Welte, Darmstadt (DE); Uri Stern, Kiryat Tivon (IL); Tomer Cohen, Moshav Liman (IL); Erez Graitzer, Gilon (IL)

(73) Assignees: Carl Zeiss SMT GmbH, Oberkochen (DE); Carl Zeiss SMS Ltd., D.N. Misgav (IL)

( * ) Notice: Subject to any disclaimer, the term of this patent is extended or adjusted under 35 U.S.C. 154(b) by 295 days.

(21) Appl. No.: 16/269,771

(22) Filed: Feb. 7, 2019

(65) Prior Publication Data
US 2019/0170991 A1 Jun. 6, 2019

Related U.S. Application Data

(63) Continuation of application No. PCT/EP2017/070047, filed on Aug. 8, 2017.

(30) Foreign Application Priority Data

Aug. 8, 2016 (DE) .......................... 102016214695.5

(51) Int. Cl.
*G02B 21/06* (2006.01)
*G02B 21/00* (2006.01)
(Continued)

(52) U.S. Cl.
CPC ....... *G02B 21/0072* (2013.01); *G02B 21/006* (2013.01); *G02B 21/0064* (2013.01);
(Continued)

(58) Field of Classification Search
CPC .............. G02B 21/0072; G02B 21/006; G02B 21/0064; G02B 21/241; G02B 21/361;
(Continued)

(56) References Cited

U.S. PATENT DOCUMENTS

| 4,953,962 A | 9/1990 | Esswein et al. |
| 7,733,564 B2 | 6/2010 | Wolleschensky et al. |

(Continued)

FOREIGN PATENT DOCUMENTS

| DE | 112013006111 | 9/2015 | .............. G02B 21/00 |
| EP | 2 498 116 | 9/2012 | .............. G02B 21/32 |

OTHER PUBLICATIONS

German Office Action directed to German Patent Application DE 102016214695.5, dated Feb. 13, 2017.
(Continued)

*Primary Examiner* — Arnel C Lavarias
(74) *Attorney, Agent, or Firm* — Fish & Richardson P.C.

(57) ABSTRACT

An optical system includes a scanning unit, a first lens-element group including at least a first lens element, and a focusing unit which is designed to focus beams onto a focus, wherein the focusing unit includes a second lens-element group including at least a second lens element and an imaging lens. The imaging lens further includes a pupil plane and a wavefront manipulator. The wavefront manipulator is arranged in the pupil plane of the imaging lens or in a plane that is conjugate to the pupil plane, or the scanning unit of the optical system is arranged in a plane that is conjugate to the pupil plane and the wavefront manipulator is arranged upstream of the scanning unit in the light
(Continued)

Figure 1:
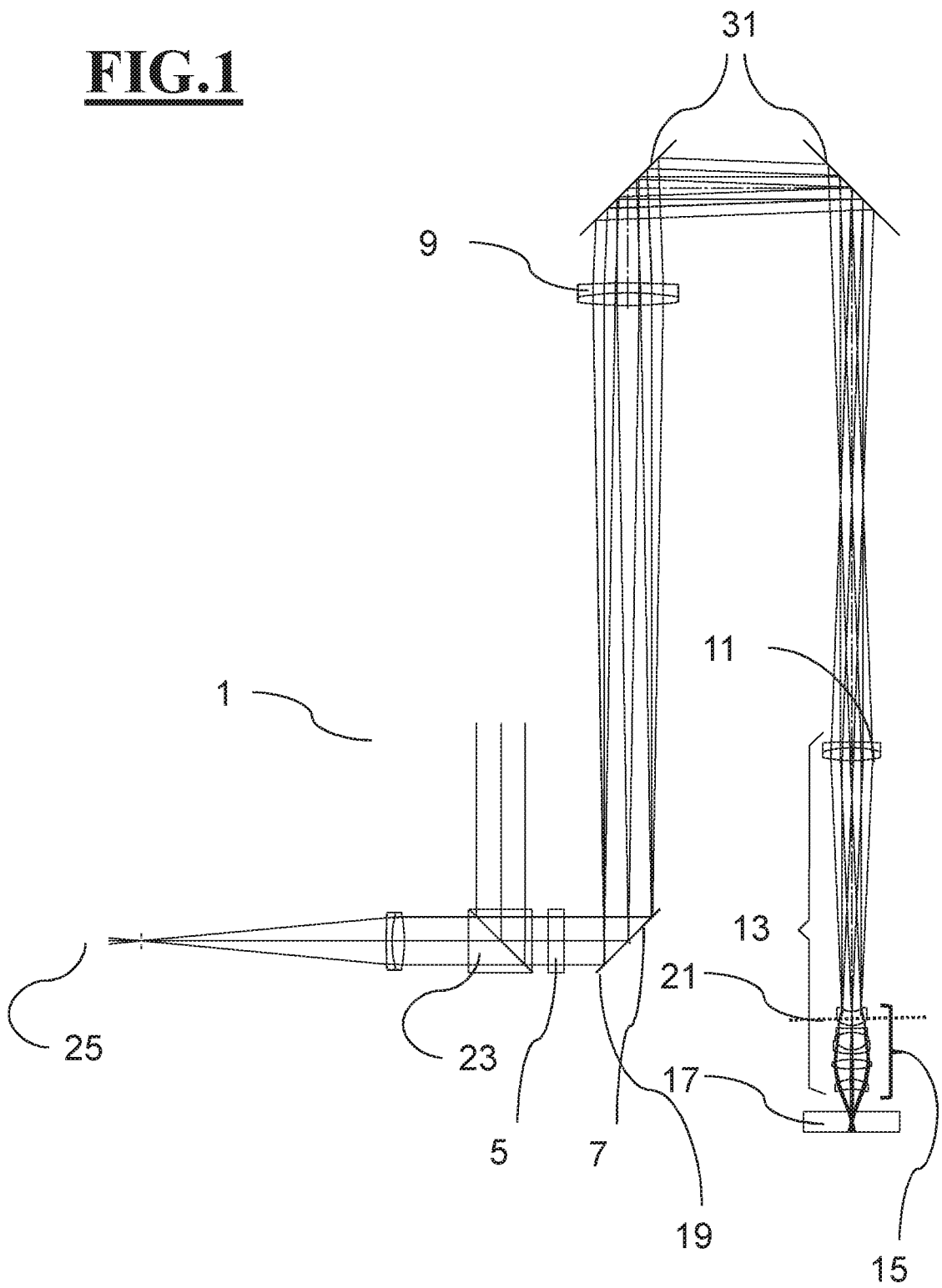

direction. The focus of the second lens-element group lies in the pupil plane of the imaging lens in all focal positions of the focusing unit.

20 Claims, 12 Drawing Sheets

(51) Int. Cl.
  *G03F 1/72* (2012.01)
  *G02B 21/24* (2006.01)
  *G02B 21/36* (2006.01)
  *G02B 26/06* (2006.01)
(52) U.S. Cl.
  CPC ......... *G02B 21/241* (2013.01); *G02B 21/361* (2013.01); *G03F 1/72* (2013.01); *G02B 26/06* (2013.01)
(58) Field of Classification Search
  CPC .... G02B 26/06; G02B 21/00; G02B 21/0004; G02B 21/002; G02B 21/0032; G02B 21/0052; G02B 21/0076; G02B 21/06; G02B 27/0025; G02B 27/0068; G03F 1/72
  USPC ........ 359/385.362, 363, 368, 369, 379, 388, 359/389, 390
  See application file for complete search history.

(56) References Cited

U.S. PATENT DOCUMENTS

| | | | |
|---|---|---|---|
| 8,730,573 B2* | 5/2014 | Betzig | G02B 26/06 |
| | | | 359/385 |
| 9,651,872 B2* | 5/2017 | Feldmann | G03F 7/70266 |
| 2005/0207003 A1 | 9/2005 | Kobayashi | |
| 2007/0268592 A1* | 11/2007 | Kam | G02B 27/0068 |
| | | | 359/637 |
| 2012/0314196 A1* | 12/2012 | He | G03F 7/70091 |
| | | | 355/67 |
| 2015/0301256 A1 | 10/2015 | Takiguchi | |
| 2015/0362713 A1 | 12/2015 | Betzig et al. | |
| 2016/0003740 A1* | 1/2016 | Tao | G01N 21/6458 |
| | | | 250/459.1 |
| 2016/0161729 A1 | 6/2016 | Honda | |

OTHER PUBLICATIONS

English Translation of Taiwan Office Action directed to Taiwanese Patent Application TW 106126548, dated Jul. 13, 2018.
The International Search report directed to PCT/EP2017/070047, dated Dec. 11, 2017.

* cited by examiner

OPTICAL SYSTEM AND METHOD FOR CORRECTING MASK DEFECTS USING THE SYSTEM

CROSS REFERENCE TO RELATED APPLICATIONS

This application is a continuation of and claims priority under 35 U.S.C. § 120 from PCT Application No. PCT/EP2017/070047, filed on Aug. 8, 2017, which claims priority from German Application DE 10 2016 214 695.5, filed on Aug. 8, 2016. The entire contents of each of these priority applications are incorporated herein by reference.

DESCRIPTION

The invention relates to an optical system and a method for correcting defects in masks, as used in microlithography.

As a result of the continuously growing integration density in the semiconductor industry, photolithographic masks or templates for nano-imprint technology must image ever smaller structures onto a light-sensitive layer, i.e. onto a photoresist on wafers. In order to meet these requirements, the exposure wavelength for photolithographic masks has been shifted from the near ultraviolet via the mid-ultraviolet into the far ultraviolet range of the electromagnetic spectrum. Currently, use is normally made of a wavelength of 193 nm for exposing the photoresist on wafers. As a consequence, the production of photolithographic masks with increasing resolution becomes ever more complex and therefore also ever more expensive. In future, photolithographic masks will use substantially shorter wavelengths in the extreme ultraviolet (EUV) wavelength range of the electromagnetic spectrum (approximately 13.5 nm).

Photolithographic masks need to satisfy very stringent requirements in respect of transmission homogeneity, flatness, purity and temperature stability. In order to be able to produce photolithographic masks with a reasonable yield, it is necessary to correct defects or faults of masks at the end of the production process.

Femtosecond light pulses from a laser source may be used to correct defects of photolithographic masks and templates for nano-imprint lithography. To this end, a high local energy density is produced in the transparent material of a photolithographic mask or in the template with the aid of the laser source by way of focusing onto a very small focus region, and this leads to local melting of the transparent material. This local melting induces local variation in the density of the transparent material or of the template material. A local density variation is also referred to as a pixel below. The introduction of a local density variation by the local application of the laser beam onto the material is referred to below as the writing of pixels into the transparent material.

The production of pixels in a transparent substrate by way of femtosecond light pulses with a high intensity induces a local nonlinear optical process in the interaction zone of the photons of the light pulse with the electrons of the substrate. The introduction of a plurality of, in particular, asymmetrical pixels into the transparent substrate results in a locally varying displacement of pattern elements which are arranged on the surface of the transparent substrate. Moreover, the writing of pixels into a transparent substrate leads to a second effect on the substrate since the pixels locally modify the optical transmission of the transparent substrate.

The transparent material of a photolithographic mask usually has a thickness of a few millimeters. By way of example, use is made of masks which comprise a transparent substrate made of 6.35 mm fused silica. A different corrective effect emerges depending on the depth at which a pixel is written into the transparent substrate. It is therefore desirable to be able to control the position of the pixel in this depth dimension. However, a different portion of the transparent substrate is situated between the desired focus region and the light source depending on the desired depth. Since the refractive index of the transparent substrate differs from that of the surroundings, wavefront errors which change the optical quality of the focus region are introduced.

A similar problem also emerges in the field of microscopy, in particular laser scanning microscopy. In this case, samples to be examined are situated in a sample carrier. Here too, it is necessary to drive to different focal positions, which should be imaged with good quality in every focal position. This means that the deviation of the wavefront from a reference wavefront should be small.

U.S. Pat. No. 4,953,962 proposes imaging lenses, which are able to compensate wavefront errors that are introduced by different coverslip thicknesses. There, two movable lens elements and a modifiable distance between the last lens element and the sample are used for compensation purposes.

U.S. Pat. No. 7,733,564 B2 describes a microscope with a wavefront modulator (WFM) for changing the focal position. A WFM renders it possible to change the focal position within the sample, even though the working distance between the front lens element of the imaging lens and the sample remains fixed. The WFM is arranged between the imaging lens and an intermediate image plane. Here, the object of the WFM lies in producing a focus in the sample, the position of which in the sample can be changed. However, the range of focal positions in which the focus has a sufficient quality is restricted to a few micrometers.

US 2016/0161729 A1 describes a light-scanning microscope with an LCOS element for structured illumination of a sample, with this element additionally being used for correcting aberrations and for focusing.

Further microscopes with wavefront manipulators are known from US 2005/0207003 A1, EP 2 498 116 A1, DE 11 2013 006111T5 and US 2015/0362713 A1.

A further application is found in the field of vitrography, in which the structure in the interior of the glass is likewise modified. A further application is found in 3-D printing from liquid polymers ("optical bonding"), in which a transparent polymer solution is made to cure by use of photo-induced polymerization. Here, the polymer solution adopts the role of the sample.

In a general aspect, the present invention provides an optical system which ensures excellent optical quality of the focus region when the position of the focus within a sample is changed over a large range.

In accordance with a first aspect of the invention, the latter comprises an optical system with a scanning unit which is designed in such a way that the focus can be displaced laterally in relation to the optical axis, a first lens-element group comprising at least a first lens element, a focusing unit which is designed to focus beams onto a focus, wherein the focusing unit is movably arranged along an optical axis of the optical system in such a way that the focal position can be changed along the optical axis of the optical system. The focusing unit, in turn, comprises a second lens-element group comprising at least a second lens element and an imaging lens. The imaging lens comprises a pupil plane. The optical system comprises a wavefront manipulator, which is designed in such a way that the root mean square (RMS) wavefront error is less than 100 m$\lambda$, preferably less than 20 mλ, in at least two focal positions of the focusing unit that differ from one another. Here, the wavefront manipulator is arranged in the pupil plane of the imaging lens or in a plane that is conjugate to the pupil plane of the imaging lens. Alternatively, the scanning unit can also be arranged in a plane that is conjugate to the pupil plane of the imaging lens and the wavefront manipulator can simultaneously be arranged upstream of the scanning unit in the light direction. The focus of the second lens-element group lies in the pupil plane of the imaging lens in both focal positions of the focusing unit. Thus, either the wavefront manipulator or the scanning unit is imaged into the pupil plane of the imaging lens, independently of the positioning of the focusing unit.

In the present application, a pupil plane is understood to mean the plane of a stop or the plane of the image of a stop. A stop is understood to mean an element which delimits the aperture. Here, this can be a separate opaque component or the bound of an optical element, such as e.g. a mounting.

Likewise, an optical axis in the present application is also understood to be an optical axis which only extends in a straight line through portions of the optical system. In particular, the deflection of the optical axis by folding mirrors changes the direction of the optical axis but has no effect, or only a minor effect, on the optical design.

The optical quality of a focus in the transparent substrate can be described by the deviation of the wavefront from a reference wavefront. Here, a predetermined ideal wavefront is referred to as reference wavefront. This reference wavefront may be spherical or else aspherical. A spherical reference wavefront is often used in a laser scanning microscope. Aspherical wavefronts such as astigmatic wavefronts are known from the correction of photomasks. A light source provides illumination light with a wavelength λ. A multiplicity of light sources are known. Advantageously, use can be made of laser light sources. Laser light sources can be operated continuously or in a pulsed manner.

The deviation of the wavefront from the reference wavefront can be quantified by the RMS wavefront error, i.e. the square root of the normalized sum of the squares of the deviation from the reference wavefront. This RMS wavefront error is often specified as a fraction of the employed laser wavelength λ. Accordingly, for example, 1 mλ corresponds to one thousandth of the laser wavelength. For the present application, a focus is of the highest quality if the corresponding RMS wavefront error is less than 20 mλ. The focus will have a high quality for an RMS wavefront error in the range of 20 mλ to 100 mλ. The focus will have a medium quality for an RMS wavefront error in the range of 100 mλ to 200 mλ.

The physical cause of the deviation of the wavefront from the reference wavefront can be found in the refractive index of the transparent material. When the focal position is changed in the transparent substrate, there is a change in the distance of the focus from the surface of the transparent substrate in the direction of the optical axis. Hence, the light rays take different geometric paths within the transparent substrate in the case of different focal positions. If a change in the focal position is now produced by a movement of the transparent substrate relative to a stationary focal position, as is the case in e.g. a conventional microscope, there is also a change in the optical path, i.e. in the product of refractive index of the transparent substrate at the wavelength of the laser light source and the length of the geometric path.

By way of example, if the transparent material is water, the refractive index in the case of conventional wavelengths may be approximately n≈1.33. In the case of objects made of fused silica, the refractive index may be n≈1.46. Foci of a sufficient quality are necessary, in particular for multi-photon processes, in which two or more photons must collide at an instant.

If the refractive index n of the transparent substrate is equal, or close, to the refractive index of the surrounding medium, the difference between the wavefront and the reference wavefront does not change in the case of a change in the focal position.

If the transparent substrate is a plane plate and only a focus on the optical axis is considered, the wavefronts of the different foci deviate from the reference wavefront mainly on account of spherical aberrations. If the focus does not lie on the optical axis but is laterally offset therefrom, further aberrations additionally occur. Other causes of deviations of the wavefront from the reference wavefront are also possible, for example as a result of a geometric form which deviates from the plane plate form or as a result of an inhomogeneous distribution of the refractive index in the transparent substrate. It is the object of the wavefront manipulator to introduce a correction of the wavefront which counteracts the spherical aberrations and/or other aberrations from other sources. As a result, a focus in which the RMS of the wavefront is less than 100 mλ, preferably less than 20 mλ, is obtained in at least two focal positions. This correction of the wavefront may differ in different focal positions. In particular, it may differ along the optical axis and also laterally to the optical axis of the system.

In order to be able to ensure that the wavefront manipulator is able to correct the wavefront in such a way that an RMS wavefront error of less than 100 mλ, preferably less than 20 mλ, is achieved, it is necessary to position the wavefront manipulator and the pupil plane in such a way that rays which impinge on a point of the wavefront manipulator also impinge on exactly one point of the pupil plane. In this context, a point should be understood within the context of optics and not as a purely mathematically geometric term. This positioning of the wavefront manipulator can be achieved by virtue of the wavefront manipulator being arranged directly in the pupil plane of the imaging lens. A further option consists in arranging the wavefront manipulator in a plane that is conjugate to the pupil plane of the imaging lens, i.e. to image said wavefront manipulator in this pupil plane.

The imaging of the wavefront manipulator or of the scanning unit into the pupil plane of the imaging lens must be provided for both focal positions. Expressed differently, these elements are imaged into this pupil plane independently of the positioning of the focusing unit.

The deviation of the wavefront from the reference wavefront, and hence the deterioration in the focus quality, increases with increasing distance from the best focal position and with a higher numerical aperture NA of the optical system. In order to be able to compare different optical systems, which differ in terms of numerical aperture, wavelength and employed materials with different refractive indices, a parameter with which the geometric extent can be evaluated independently of the system is required in addition to the evaluation of the focus quality by the RMS wavefront error. To this end, the Rayleigh criterion for the depth of field is used in the present document. From this, the Rayleigh length $d_R$ emerges as $d_R = \lambda n/(2\,NA^2)$. By way of example, a Rayleigh length of $d_R = 0.96$ μm emerges for an optical system with a numerical aperture NA=0.65, a wavelength λ=532 nm and a refractive index n=1.52. The range in which the foci still have a good quality of the wavefront can then be specified as a multiple of the Rayleigh length of the considered system. This allows different optical systems to be compared.

Therefore, a further aspect of the invention lies in providing an optical system with a focusing range of more than 500 $d_R$, preferably more than 1000 $d_R$, particularly preferably more than 2200 $d_R$. Such a large focusing range with, at the same time, a good imaging quality is achieved by virtue of the positioning of the focal position being set by the movement of the focusing unit, while the wavefront manipulator corrects the spherical aberrations. Thus, in particular, the wavefront manipulator is not used for focusing.

In a further aspect of the invention, the optical system further comprises a scanning unit which is designed in such a way that the focus can be displaced laterally in relation to the optical axis. Such a scanning unit renders it possible to scan the focus in a relatively large spatial region on the sample. By way of example, if the optical system is used to examine photolithographic masks, it is possible to scan a region of the mask without mechanically moving the mask in the lateral direction. This has an advantageous effect on the scanning time and hence on the number of masks which can be examined in a given unit of time.

Such scanning units can be embodied in many different ways. A tiltable mirror can be one possible embodiment. Such a mirror can be tiltable about one axis, in order to enable a one-dimensional scan, or else be tiltable about two axes that are not parallel to one another, in order to enable a two-dimensional scan. It is also possible to arrange two mirrors in succession in the light direction, said mirrors each being tiltable about an axis that is not parallel to the other one, in order to obtain a two-dimensional scan. In particular, it is advantageous if the tilt axes are perpendicular to one another. Furthermore, it is advantageous if the pivot points of the two mirrors are as closely adjacent to one another as possible. It is also possible and advantageous to image the pivot points of the two mirrors onto one another.

In a further embodiment of the invention, the scanning unit comprises one or more AODs (acousto-optic deflectors). If use is made of two AODs, it is likewise advantageous to image these onto one another. In these components, the deflection angle of a light ray can be changed by applying a sound wave that passes through the component. An advantage of these elements is a fast response time and the easy controllability with which a desired deflection angle can be set. Similarly to a tiltable mirror, an AOD can operate in a one-dimensional scanning direction, or else in two dimensions. It is likewise possible to arrange in succession two AODs that operate in one dimension in place of an AOD that operates in two dimensions. In order to obtain a two-dimensional scanning effect, it is necessary that the two one-dimensional scanning directions of the individual AODs are not parallel. In particular, it is advantageous if the scanning directions are perpendicular to one another.

In a further aspect of the invention, the optical system further comprises a light source and the wavefront manipulator is arranged between the light source and the scanning unit. In this case, a stop is arranged at or downstream of the scanning unit. Therefore, even though the wavefront manipulator is not in a pupil plane in this position, it is nevertheless in a parallel beam path, and so the important condition is satisfied that all rays which extend through a point on the wavefront manipulator also impinge on a common point in the pupil plane of the imaging lens. This condition may even be satisfied if the wavefront manipulator is arranged in a convergent or diverging beam path upstream of the scanning unit in the light direction. Since different lateral foci are only produced by the positioning of the scanning unit, it suffices in this configuration if the scanning unit itself is arranged in a plane that is conjugate to the pupil plane of the imaging lens. Thus, the scanning unit is imaged into the pupil plane of the imaging lens. This can ensure that the wavefront manipulator can correct the RMS wavefront error in such a way that it is less than 100 mλ, preferably less than 20 mλ, in at least two focal positions of the focusing unit that differ from one another.

In a further aspect of the invention, the wavefront manipulator is imaged into the pupil plane of the imaging lens. Moreover, in the present application, a pupil plane should always also be understood to mean every pupil plane that is conjugate to a specific pupil plane and a field plane should always also be understood to mean every field plane is that is conjugate thereto. In summary, three positions in which the wavefront manipulator can be arranged are preferred, even if there may also be further preferred positions. These are, firstly, the arrangement of the wavefront manipulator in the pupil plane of the imaging lens, secondly, in a plane that is conjugate to the pupil plane of the imaging lens and, thirdly, upstream of the scanning unit in the light direction, with the scanning unit itself being arranged in a plane that is conjugate to the pupil plane of the imaging lens. Positioning in a conjugate plane to the pupil plane of the imaging lens is advantageous in that it is more easily accessible since the pupil plane itself need not always lie in the space between optical elements but may also be situated in the interior of a lens element. Further, positioning the wavefront manipulator in a conjugate plane is advantageous since this position may remain stationary, and hence the wavefront manipulator need not be moved along as part of the focusing unit.

In a further aspect of the invention, the optical system comprises a wavefront manipulator that is designed as a deformable mirror. Deformable mirrors are known from a multiplicity of applications, from astronomical telescopes via microlithographic projection exposure apparatuses to applications in metrology. An advantage of deformable mirrors consists in the fact that the manipulation can be effectuated from the non-illuminated rear side of the mirror. As a result, it is possible to apply elements that cause the deformation of the mirror at every point on the mirror. As a result, it is possible to set a large multiplicity of correction wavefronts.

In a further aspect of the invention, the optical system comprises a focusing unit that is designed in such a way that a point on a sample is imaged into an image point in an image plane. Thus, a point of the sample at a finite distance from the focusing group is imaged into an image point with likewise a finite distance from the focusing group.

In accordance with the invention, the optical system further comprises a first lens-element group comprising at least one first lens element and the focusing unit comprises a second lens-element group comprising at least one second lens element and an imaging lens, wherein the focus of the second lens-element group lies in the pupil plane of the imaging lens. Further, the first lens-element group and the second lens-element group can be designed in such a way that, together, they form a Kepler system. As a result, it is possible to form a plane that is conjugate to the pupil plane of the imaging lens. Thus, the first lens-element group and the second lens-element group form a Kepler system, by use of which the wavefront manipulator or the scanning unit is imaged into the pupil of the imaging lens. As a result of the second lens-element group being part of the focusing unit but the first lens-element group being part of the stationary, i.e. not movably arranged part of the optical system, the wavefront manipulator is imaged into the pupil plane of the imaging lens. Here, the focus of second lens-element group is situated in the pupil plane of the imaging lens in all positions of the focusing unit. Further, the focus of the first lens-element group is situated on the wavefront manipulator. As a result of this arrangement of the first lens-element group and the second lens-element group, the Kepler system can be lengthened or shortened by moving the focusing unit, without this changing its imaging properties. Imaging lenses with a plurality of pupil planes and therefore also with at least one intermediate image are also conceivable.

In a further aspect of the invention, the scanning unit with a Kepler system is imaged into the pupil plane independently of the positioning of the focusing unit. In this case, the wavefront manipulator is arranged upstream of the scanning unit in the light direction.

In a further aspect of the invention, the optical system is designed in such a way that it is telecentric on the sample side. A system that is telecentric on the sample side is understood in this case to mean an optical system that has chief rays, which extend parallel to the optical axis of the optical system, at different points in the sample plane, i.e. in the plane, in which the foci are produced. Such a system is advantageous in that the deviations of the wavefront from the reference wavefront of two points that are laterally adjacent to one another in the sample only differ slightly. Therefore, if the scanning unit focuses at adjacent points in the image plane, the respective uncorrected quality of the wavefront in each focus point is very similar. In this case, the required correction of the wavefront by the wavefront manipulator to obtain a deviation of the RMS of the wavefront from the reference wavefront that is less than 100 m$\lambda$, preferably less than 20 m$\lambda$, is independent of the lateral position of the focus. Hence, the correction need not be changed during the scanning by the scanning unit.

If, in terms of the lateral extent thereof, the entire sample is much greater than the lateral spatial region which can be driven to by use of the scanning unit, it is advantageous to use a positioning unit, in addition to the scanning unit, for positioning the sample. Thus, for example, it is possible to use a mask stage to position the mask along a path of 0.1 mm to several decimeters or even meters. The foci can then be produced in this region on a smaller spatial scale with the aid of the scanning unit. Often, positioning using such a positioning unit is slower than the adjustment by use of the scanning unit. Therefore, it is advantageous to carry out this positioning only if a positioning range that cannot be provided by the faster scanning unit is required.

In a further aspect of the invention, the latter comprises a beam splitter and an observation device, wherein the beam splitter is arranged in such a way that light is supplied to the observation device. In may be advantageous to add an observation device to the optical system such that an image of the sample can be recorded. If the optical system is used in a microscope, in particular a laser scanning microscope, an option for observing the image is even mandatory for the use thereof. By contrast, if the apparatus is an apparatus for processing masks for photolithography, an observation of the image is not mandatory, but may be useful. In this application, an observation device is understood to mean a multiplicity of detectors. By way of example, this may be an eyepiece for direct visual observation or else an image sensor such as e.g. a CCD camera or a wavefront sensor. In the case of a laser scanning microscope in particular, the observation device may also be accumulating. By way of example, the image points recorded successively in time during the scan may be combined to form an overall image. This may be carried out on a computer. Moreover, it is also possible to install a plurality of observation devices.

Therefore, the observation device is embodied as a wavefront sensor in a further aspect of the invention. The object thereof is to detect the wavefront that is set by use of the wavefront manipulator. The advantage thereof is that it is possible to check the set wavefront. In this arrangement, the observation device serves to observe the light from the light source in a pupil plane.

In a further aspect of the invention, the latter therefore further comprises a control unit which compares the data that were recorded by the wavefront sensor with an reference wavefront and transfers corrections that were calculated from deviations of the measured wavefront from the reference wavefront to the wavefront manipulator. As a result of this, a control loop is provided, the latter facilitating automatic or semiautomatic closed-loop control of the wavefront sensor in such a way that a good quality of the foci is obtained. Thus, should the control unit calculate that the RMS wavefront error is still greater than a predetermined target value, e.g. 20 m$\lambda$ or 100 m$\lambda$, from the data of the wavefront sensor after a first adjustment of the wavefront manipulator, the control unit is able to calculate correction controlling variables using characteristics of the wavefront manipulator and transfer these to the wavefront manipulator. Then, the wavefront correction of the wavefront manipulator is changed until the desired target value is obtained. Such characteristics of a wavefront manipulator are often specified as sensitivities to a normalized disturbance. By way of example, a conventional computer or a special electronic component can be used as a control unit. Other options are also conceivable.

In a further aspect of the invention, a pulsed laser is used as a light source of the optical system. Such a pulsed laser is particularly suitable for producing a high local energy density in the transparent material of a photolithographic mask by way of focusing onto a very small focus region. This leads to local melting of the transparent material. This local melting induces local variation in the density of the transparent material. As a result, a plurality of pixels can be written into the transparent substrate. As a result, it is possible to produce locally varying displacements of pattern elements that are arranged on the surface of the transparent substrate. This technique is known as registration correction. Preferably, asymmetric pixels are used for the registration correction. Moreover, pixels can be written into a transparent substrate into the transparent material, which pixels, in comparison with a surrounding material, have a modified optical transmission. This technique is known as CD correction. Preferably, symmetric pixels are used for the CD correction. It is also possible to combine both methods.

A further aspect of the invention relates to a method for correcting defects of a photolithographic mask, said method comprising:
 providing an optical system according to any one of the preceding claims,
 focusing a first focal position within the photolithographic mask using the focusing unit along an optical axis of the system,
 setting a wavefront by use of a wavefront manipulator such that the RMS wavefront error is less than 100 m$\lambda$, preferably less than 20 m$\lambda$,
 correcting a first fault of the mask by introducing a first irreversible change at the first focal position within the photolithographic mask.

The precise effect of the written pixel may depend on the position along the optical axis if the mask is arranged in the optical system. Therefore, it may be advantageous to introduce pixels for correction purposes into the substrate in a second plane or further planes. To this end, the following steps are required:

focusing a second focal position within the photolithographic mask using the focusing unit along an optical axis of the system, setting a wavefront by use of a wavefront manipulator such that the RMS wavefront error is less than 100 m$\lambda$, preferably less than 20 m$\lambda$, correcting a second fault of the mask by introducing a second irreversible change at the second focal position within the photolithographic mask.

For the purposes of correcting photolithographic masks, it is advantageous to be able to quickly change the focal position in the lateral direction. In particular, lateral scanning of the focal position is expedient. A scanning unit can be used to this end.

The wavefront can be measured using a wavefront sensor when defects of a photolithographic mask are corrected. The advantage thereof is that it is possible to check the setting of the wavefront manipulator. This check can be carried out continuously during the correction operation or at specifically selected monitoring times.

Then, it is possible to create a control loop when defects of a photolithographic mask are corrected, said control loop further processing the measured wavefront using the following steps:

comparing with a reference wavefront, calculating a correction wavefront from this comparison such that the RMS wavefront error is reduced, setting new control signals for the wavefront manipulator from the correction wavefront and transmitting the control signals to the wavefront manipulator.

After the wavefront has been corrected, the wavefront can be measured again and a new and refined correction can be determined. A control loop is thus set up.

Figure 2:
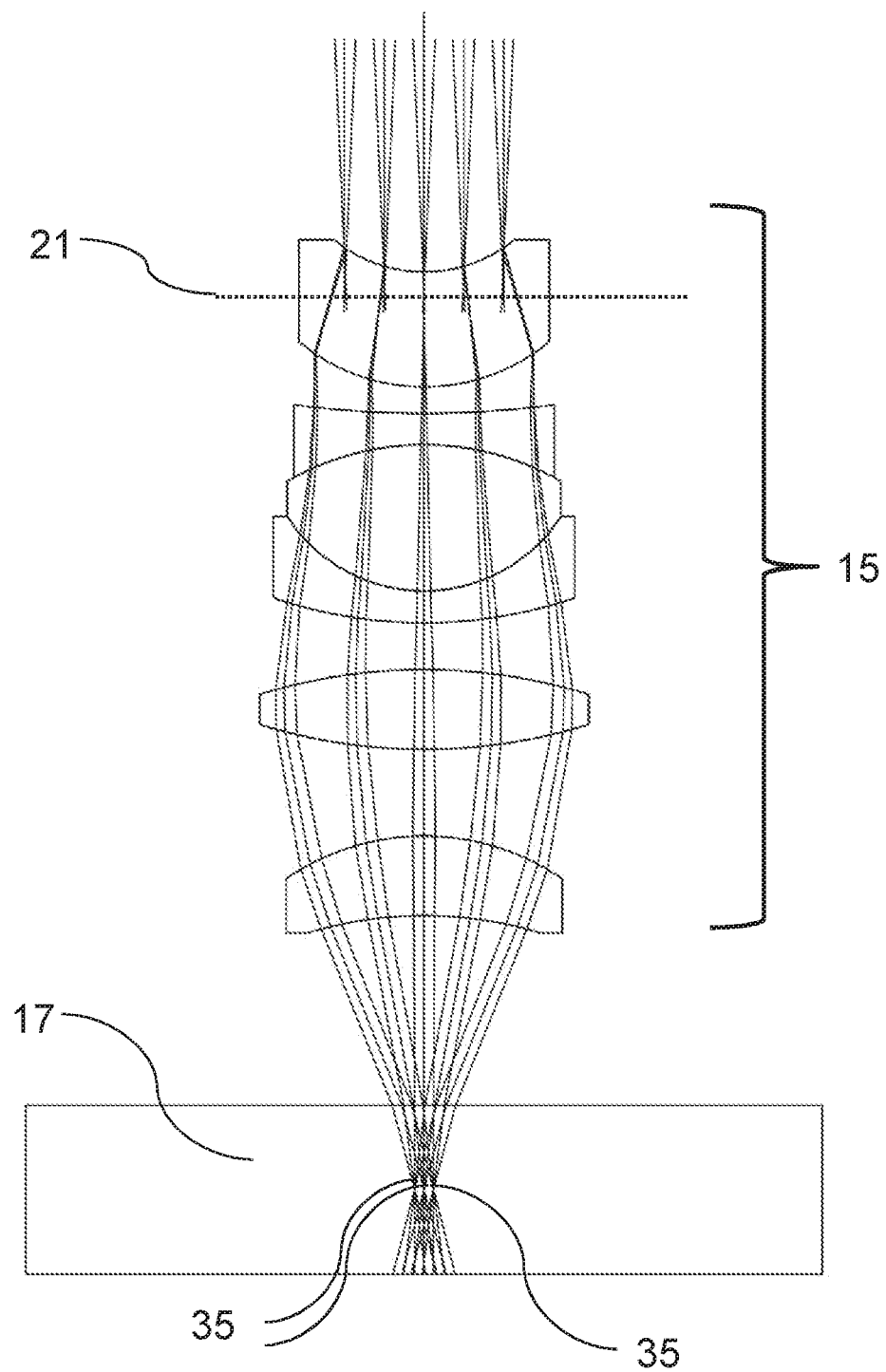
Figure 3:
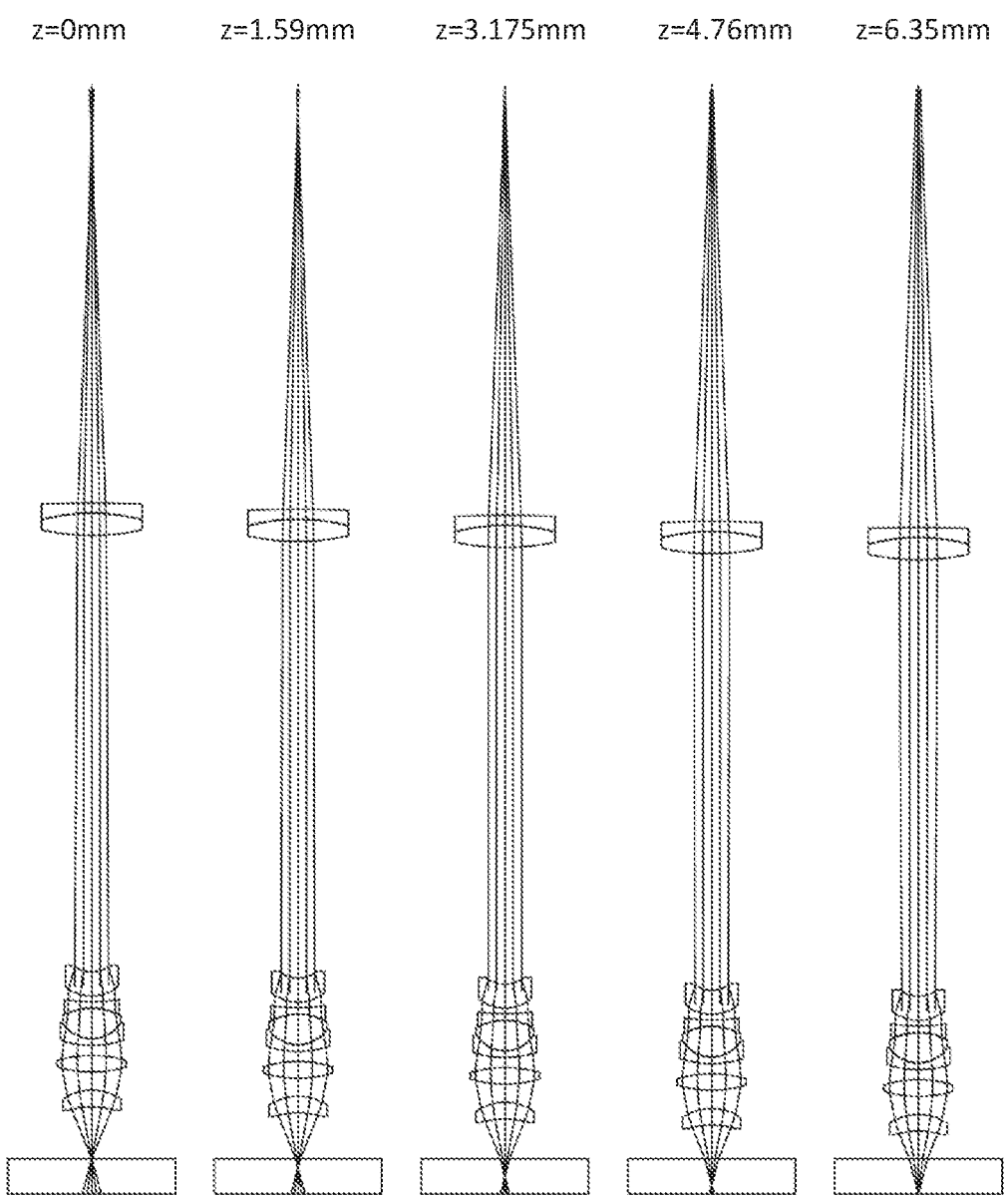
Figure 4:
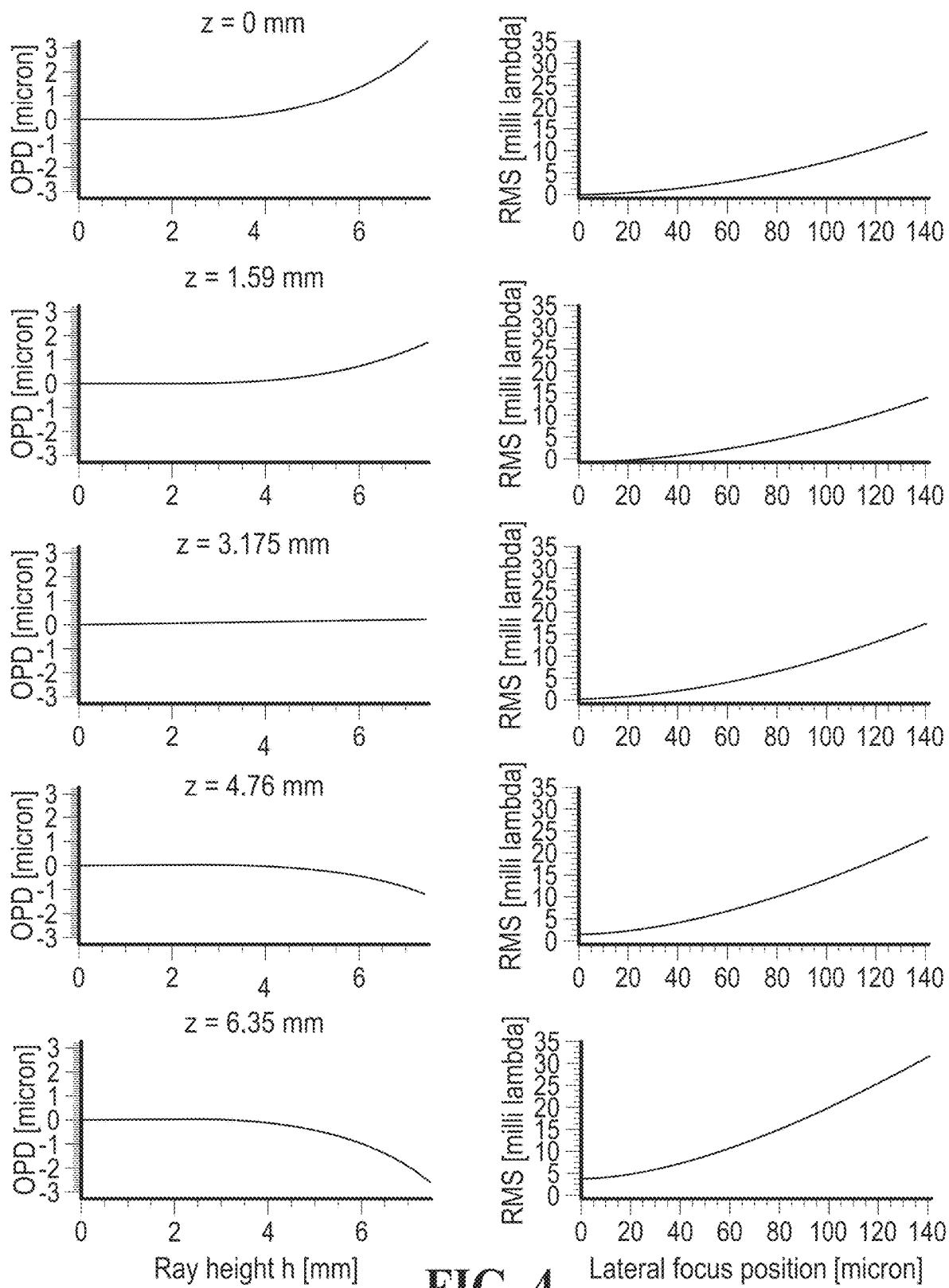
Figure 5:
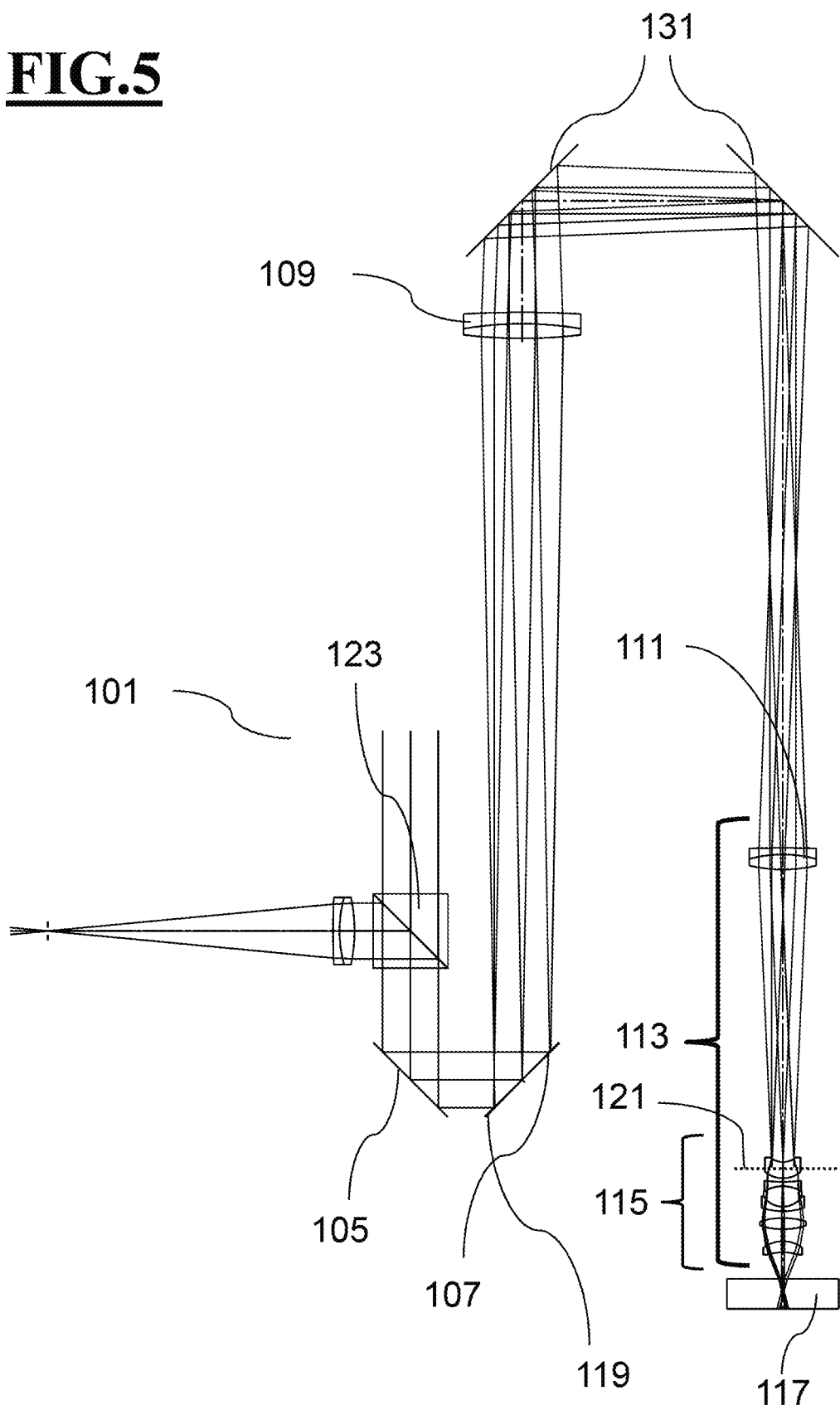
Figure 6:
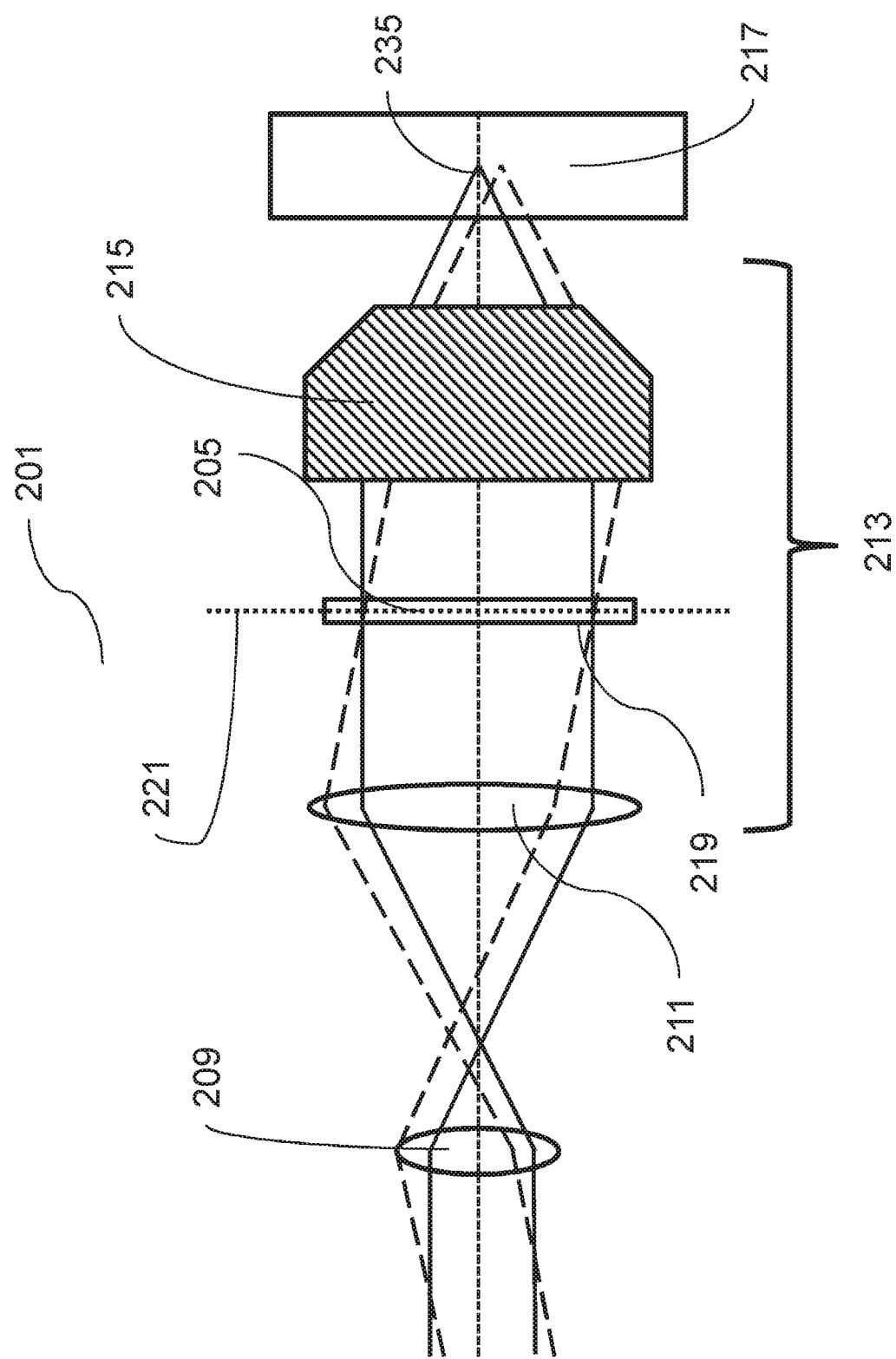
Figure 7:
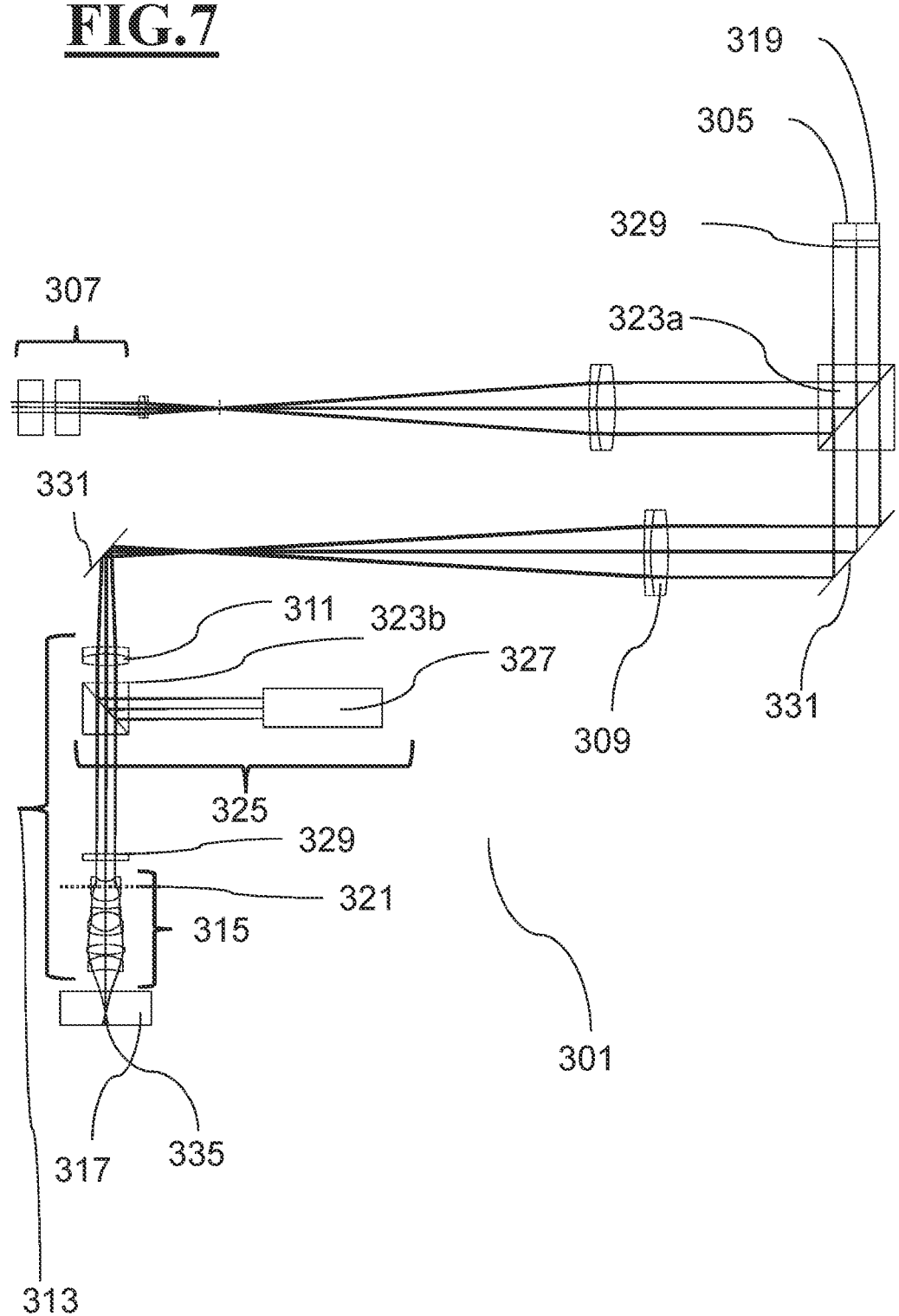
Figure 8:
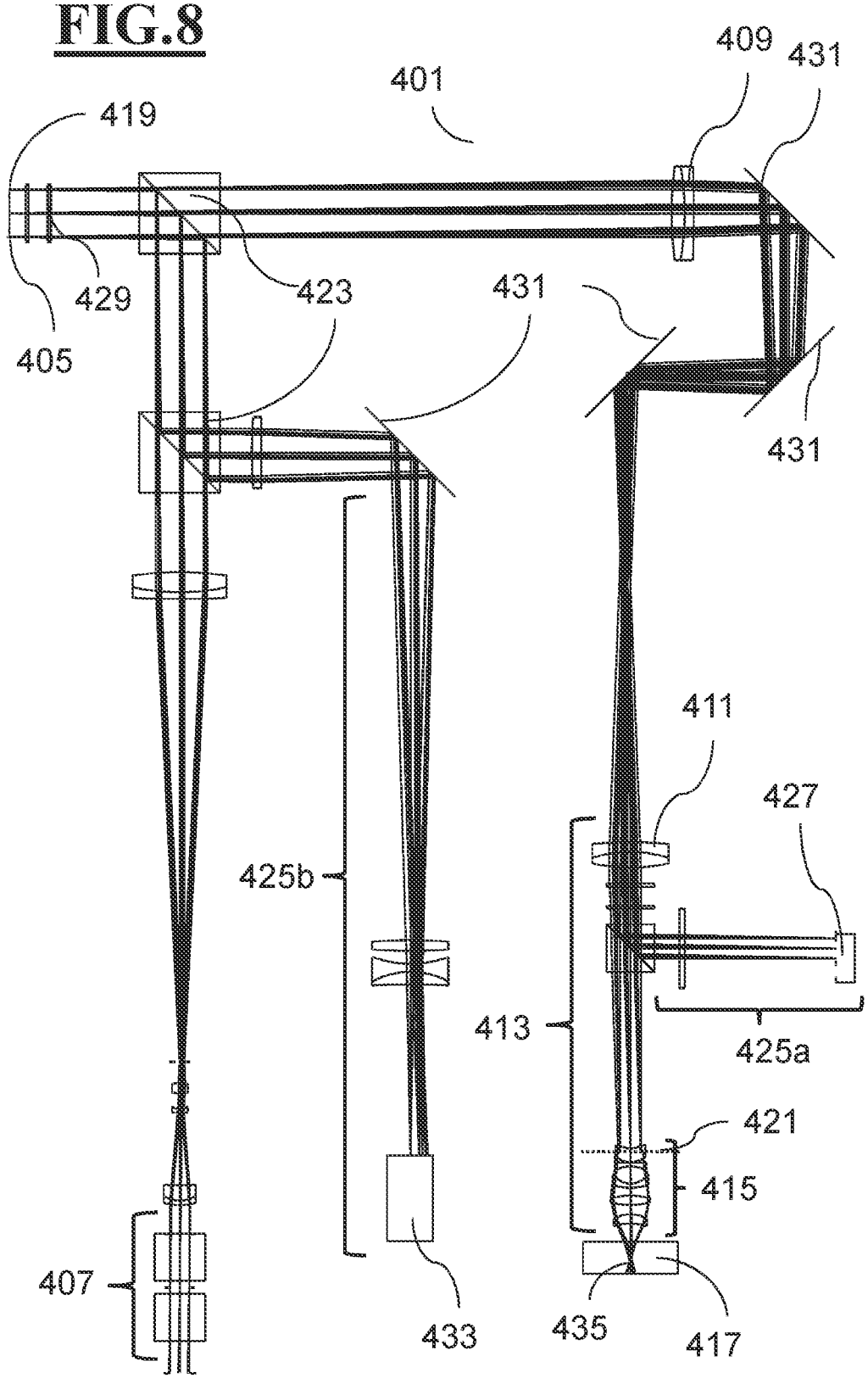
Figure 9:
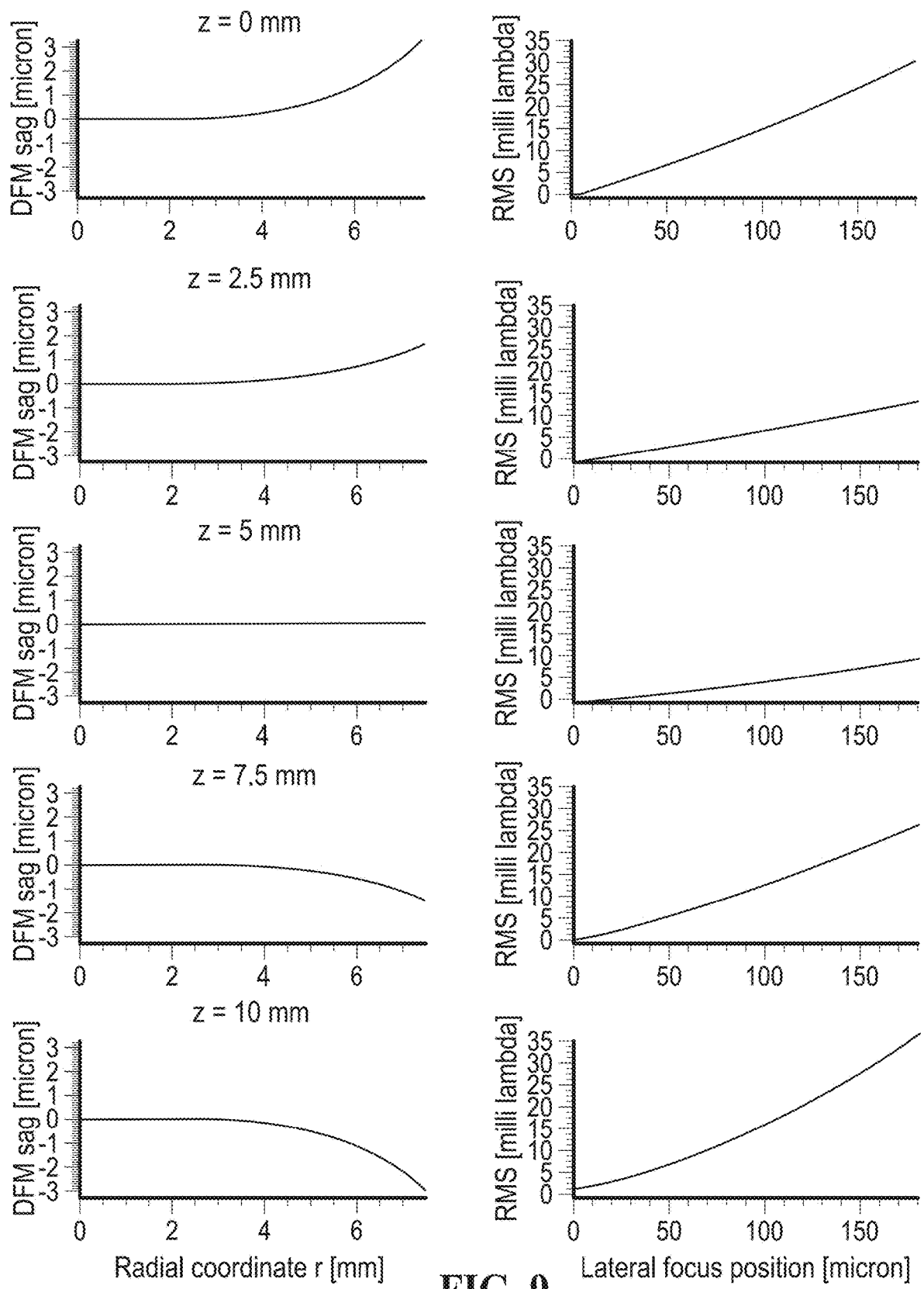
Figure 10:
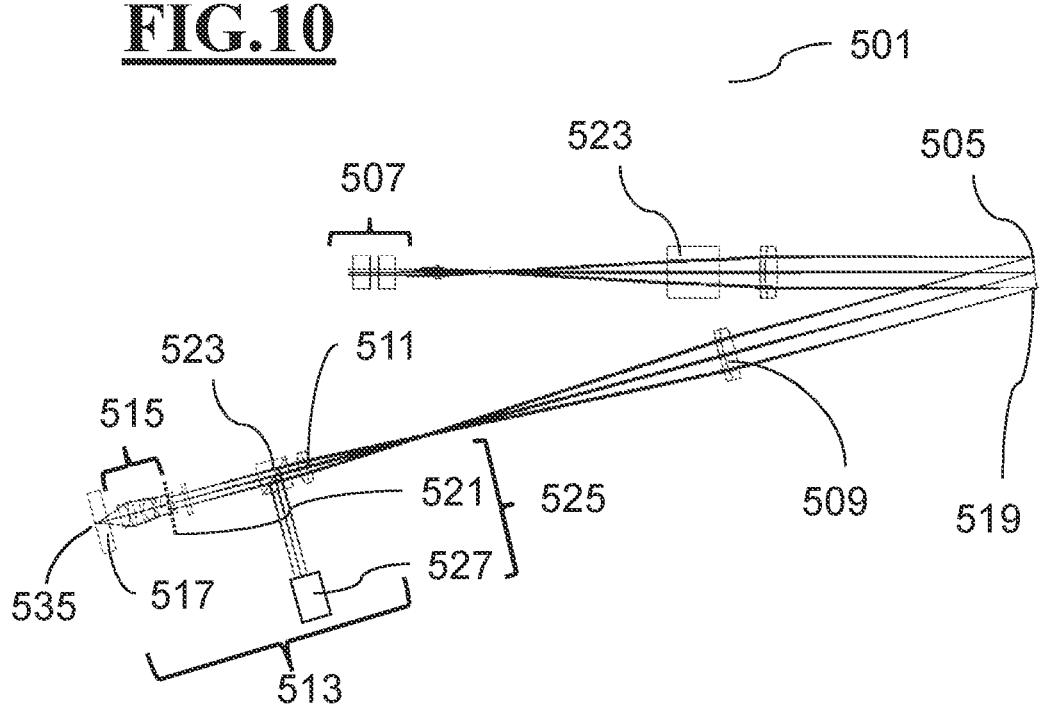
Figure 11:
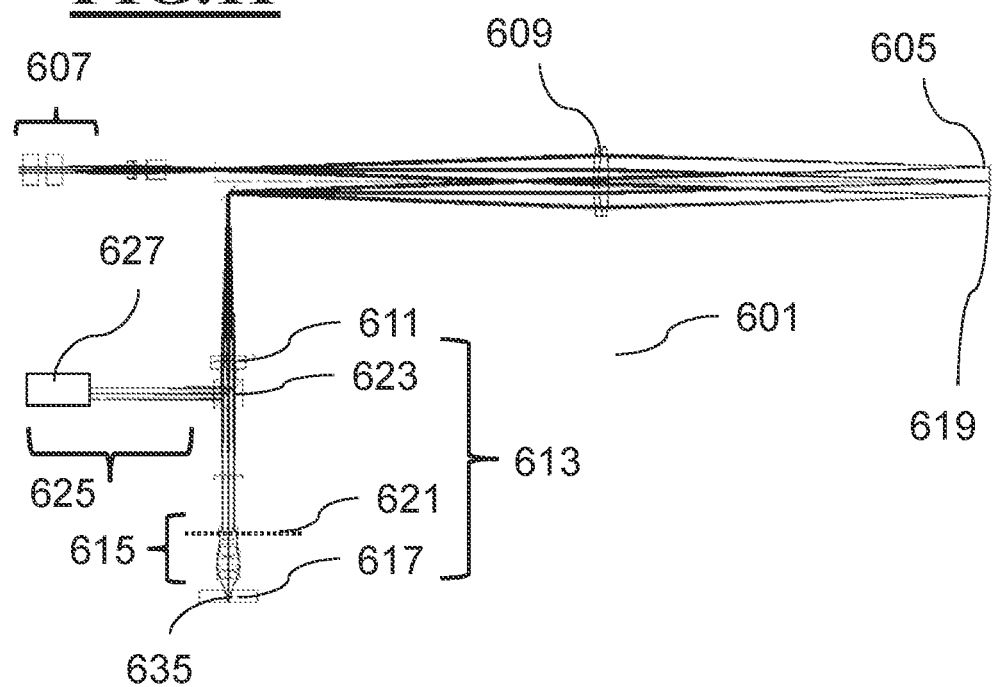
Figure 12:
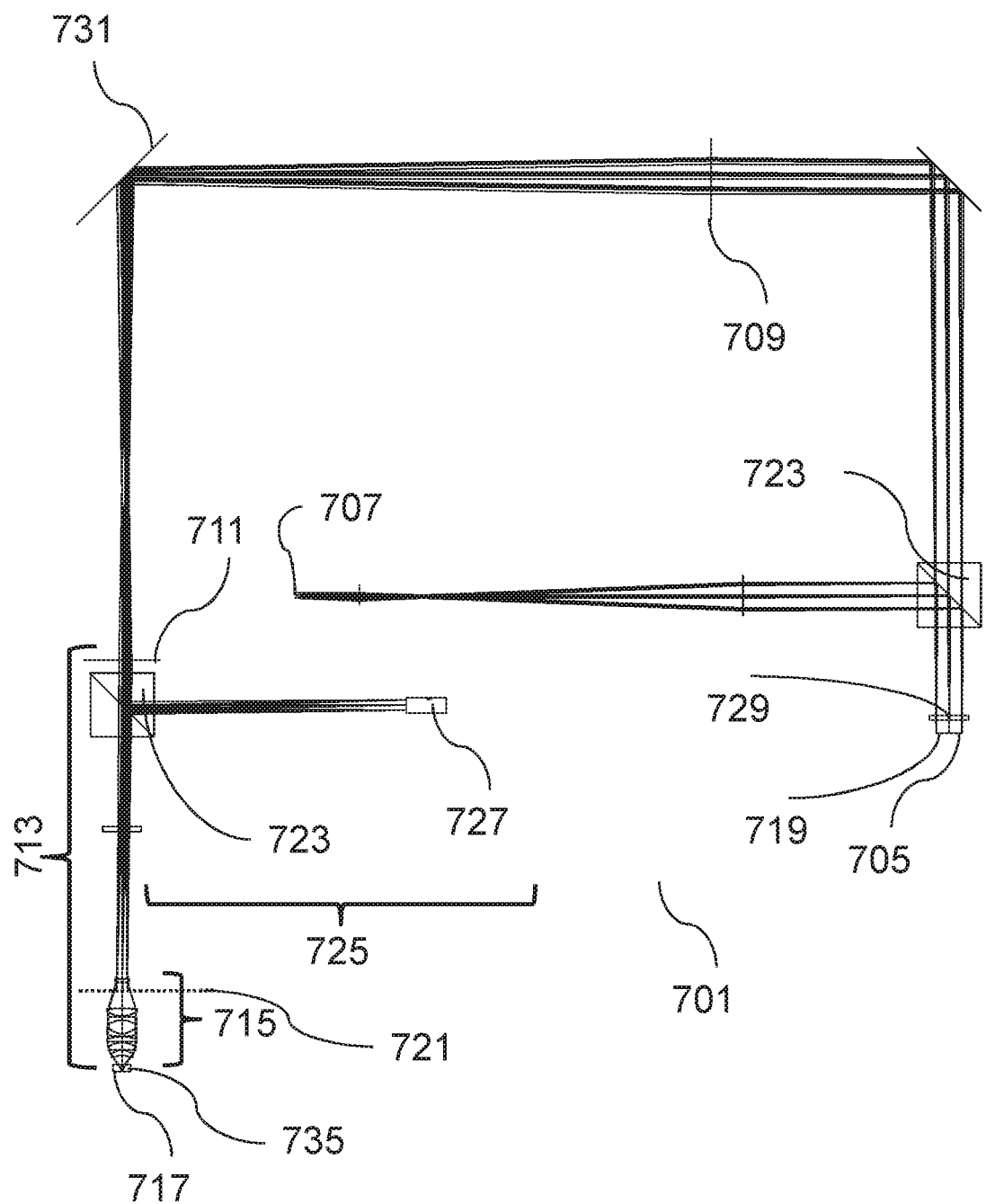
Figure 13:
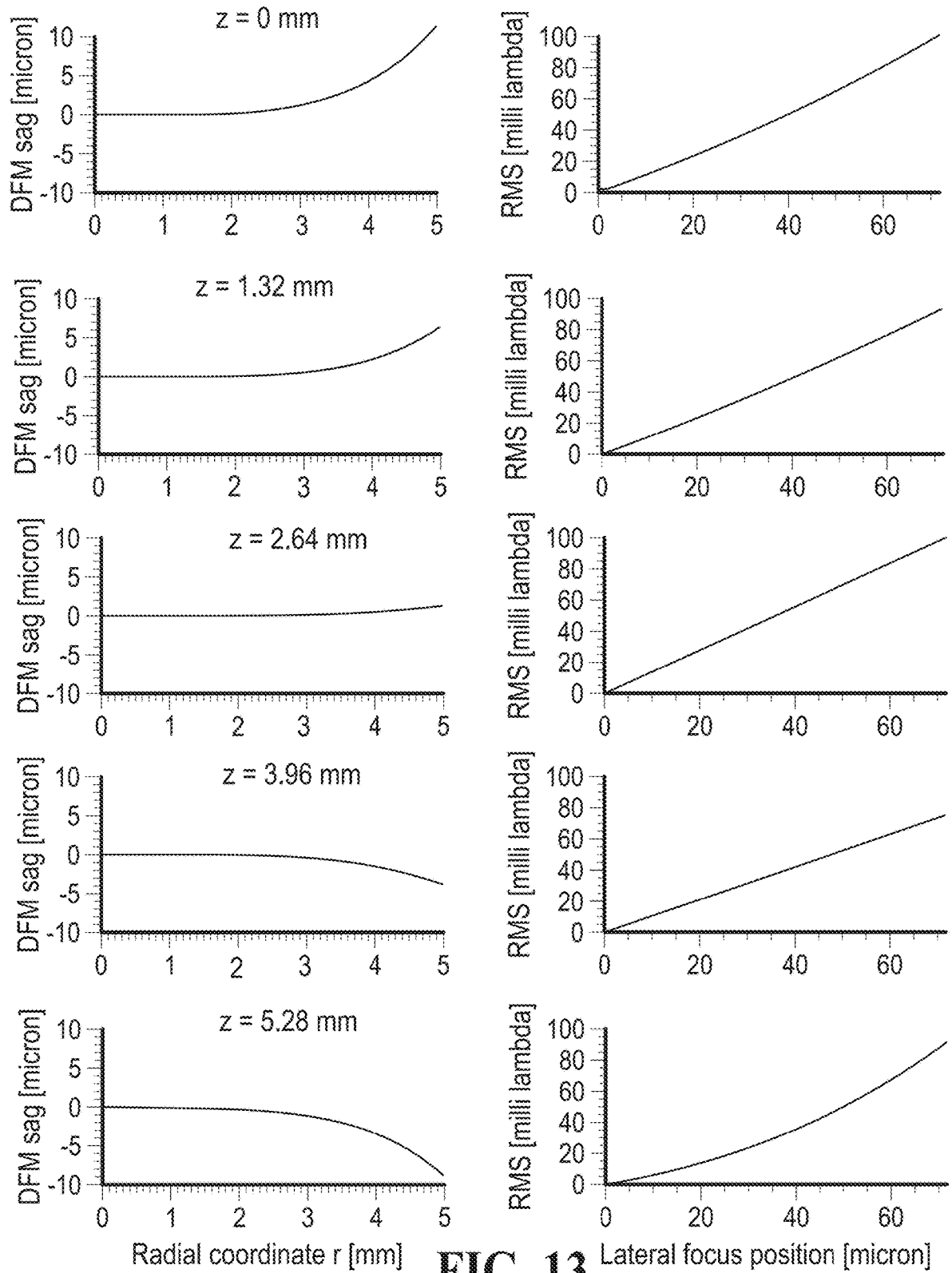

Exemplary embodiments of the invention are explained in more detail below with reference to the figures. In the figures:

FIG. 1 shows a schematic lens-element section of a first embodiment, with the focus lying in the center of the likewise represented sample, FIG. 2 shows a schematic magnified lens-element section of the imaging lens in the first embodiment, with the focus lying in the center of the likewise represented sample, FIG. 3 shows five different settings of the focusing group of the first embodiment, corresponding to five different focal positions, FIG. 4 shows the change in the optical path length of the wavefront manipulator in five focal positions along a radial coordinate of the wavefront manipulator in the left-hand column, and the associated RMS wavefront error in the same five focal positions of the first embodiment in the right-hand column, FIG. 5 shows a schematic lens-element section of a second embodiment, wherein a deformable mirror is used as a wavefront manipulator, FIG. 6 shows a schematic lens-element section of a third embodiment, wherein the wavefront manipulator is arranged in the pupil plane of the imaging lens, FIG. 7 shows a schematic lens-element section of a fourth embodiment, wherein the wavefront manipulator is arranged in a plane that is conjugate to the pupil plane of the imaging lens and the optical system comprises a polarization beam splitter, FIG. 8 shows a schematic lens-element section of a fifth embodiment, wherein the system comprises two AODs and an observation device, FIG. 9 shows the deformation of the deformable mirror in five focal positions along a radial coordinate of the mirror in the left-hand column, and the associated RMS wavefront error in the same five focal positions of the fifth embodiment in the right-hand column, FIG. 10 shows a schematic lens-element section in a sixth embodiment, FIG. 11 shows a schematic lens-element section in a seventh embodiment, FIG. 12 shows a schematic lens-element section in an eighth embodiment and FIG. 13 shows the deformation of the deformable mirror in five focal positions along a radial coordinate of the mirror in the left-hand column, and the associated RMS wavefront error in the same five focal positions of the eighth embodiment in the right-hand column.

FIG. 1 shows a first exemplary embodiment of the present invention in a schematic illustration. The quality of the foci in this case relates to a spherical reference wavefront. The optical system 1 has a numerical aperture (NA) of 0.4. The sample 17 has a refractive index of n=1.461. The light source has a wavelength of $\lambda$=532 nm. Hence, this yields a Rayleigh length of $d_R$=2.43 µm for this optical system 1. The optical data for the optical system 1 are summarized in Table 1. Here, the materials NF2, NBK7, NSF5, NLASF44, NPK51 and NKZFS4 are commercially available glasses from Schott and SNBH51 is a glass from Ohara, the refractive indices of said glasses being known to a person skilled in the art. Moreover, these glass catalogues are stored in commercially available optical design programs, such as e.g. Code V or OSLO.

The optical system 1 comprises a focusing unit 13, which is designed to focus rays onto a focus 35, with the focusing unit 13 being arranged in a movable manner along an optical axis of the system such that the focal position along the optical axis of the optical system can be changed. Here, the focusing unit 13 comprises an imaging lens 15 with a pupil plane 21. The latter emerges as an image of a stop 19. In this embodiment, the stop 19 is located on a 2-D scanning mirror 7. Further, the optical system comprises a wavefront manipulator 5, which is designed in such a way that the RMS of the wavefront error is less than 100 m$\lambda$, preferably less than 20 m$\lambda$, in at least two focal positions of the focusing unit 13 that differ from one another. The wavefront manipulator 5 and the pupil plane 21 of the focusing unit 13 are positioned relative to one another in such a way that rays that impinge on the same point of the wavefront manipulator 5 impinge on a common point in the pupil plane 21 in the at least two focal positions that differ from one another.

The optical system 1 further comprises a first lens-element group 9 and the focusing unit 13 comprises a second lens-element group 11 and an imaging lens 15. In this exemplary embodiment, this first lens-element group 9 consists of two lens elements, which are embodied as a cemented member. The focal length of the first lens-element group 9 is $f_1$=200.4 mm. The second lens-element group 11 is likewise embodied as a cemented member and has a focal length of $f_2$=80.1 mm. The beam path is folded by two folding mirrors 31 between the lens elements of the first lens-element group 9 and the lens elements of the second lens-element group 11. Such folding mirrors 31 are usually introduced in order to meet requirements in respect of the installation space, i.e. the geometric dimensions of the optical system 1. They are usually plane mirrors which do not have any further optical function. A person skilled in the art knows that such folding mirrors can be added or removed, depending on the requirements.

A telecentric imaging lens 15 with a focal length $f_{lens}=8.09$ mm is arranged downstream of the second lens-element group 11 in the light direction. The imaging lens 15 is telecentric on the sample side, meaning that the wavefront-manipulator-side pupil of the imaging lens 15 is identical to the rear focal plane of the imaging lens 15. Therefore, the entire optical system 1 is designed to be telecentric on the sample side. The pupil plane 21 of the imaging lens 15 is inaccessible and lies within a lens element of the imaging lens 15. In this example, there are no further optical elements in the focusing unit 13 other than the second lens-element group 11 and the imaging lens 15.

The focus of the second lens-element group 11 lies in the pupil plane 21 of the imaging lens 15. The imaging lens 15 and the second lens-element group 11 are arranged together on a platform which is movable parallel to the optical axis of the system 1. This forms a focusing unit 13 which comprises the imaging lens 15 and the second lens-element group 11. The sample 17 to be examined is likewise illustrated and has a plane surface on the side facing the imaging lens 15. By moving the focusing unit 13 parallel to the optical axis of the optical system 1, it is possible to change the focal position within the sample 17, likewise in a manner parallel to the optical axis. Hence, the focusing unit 13 is designed in such a way that a point of the sample, which is situated at a finite distance from the imaging lens 15, is imaged into an image point in an image plane between the second folding mirror 31 and the focusing unit 13. Hence, the image plane lies at a finite distance from the focusing unit 13.

TABLE 1

| NA | 0.4 |
| --- | --- |
| Refractive index of the sample | 1.461 |
| Wavelength | 532 |

| Surface | Radius [mm] | Thickness [mm] | Material | Refractive index | Half-diameter [mm] |
| --- | --- | --- | --- | --- | --- |
| 0 | 0 | 76.614871 | | | 1 |
| 1 | 209.83 | 1.8 | NF2 | | 8.46 |
| 2 | 34.72 | 4 | NBK7 | | 8.46 |
| 3 | −41.27 | 20 | | | 8.46 |
| 4 | 0 | 20 | NBK7 | | 10 |
| 5 | 0 | 5 | | | 10 |
| 6 | 0 | 5 | NBK7 | | 10 |
| 7 | 0 | 20 | | | 10 |
| 8 | 0 | 0 | | | 14.142136 |
| 9 | 0 | 199.158603 | | | |
| 10 | 120.57 | 4 | NBK7 | | 14.8 |
| 11 | −91.73 | 3 | NSF5 | | 14.8 |
| 12 | −277.81 | 30 | | | 14.8 |
| 13 | 0 | 70 | | | 21.213203 |
| 14 | 0 | 173.825305 | | | 21.213203 |
| 15 | 209.83 | 1.8 | NF2 | | 8.46 |
| 16 | 34.72 | 4 | NBK7 | | 8.46 |
| 17 | −41.27 | 78.623879 | | | 8.46 |
| 18 | −5.3909 | 4.33 | NLASF44 | | 3.4 |
| 19 | −7.393 | 1 | | | 4.715 |
| 20 | −36.9157 | 1.18 | SNBH51 | | 4.75 |
| 21 | 10.366 | 5.5 | NPK51 | | 4.9 |
| 22 | −6.1313 | 1.2 | NKZFS4 | | 5.15 |
| 23 | −17.6655 | 1.81 | | | 5.675 |

TABLE 1-continued

| 24 | 20.9822 | 3 | NPK51 | 6.2 |
| --- | --- | --- | --- | --- |
| 25 | −20.9822 | 3.26 | | 6.2 |
| 26 | 9.173 | 3 | SNBH51 | 5.2 |
| 27 | 15.07 | 7.140532 | | 4.4 |
| 28 | 0 | 0 | | 15 |

| Surface | Decentring Δx | and tilt Δy | Δz | Alpha [°] | Beta [°] |
| --- | --- | --- | --- | --- | --- |
| 8 | 0 | 0 | 0 | 45/44.5/45.5 | 0 |
| 13 | 0 | 0 | 0 | 45 | 0 |
| 14 | 0 | 0 | 0 | −45 | 0 |

A change of the focal position in the lateral direction, i.e. in the plane that is perpendicular to the optical axis in this case, is brought about by scanning unit 7. In this exemplary embodiment, the scanning unit 7 is embodied as a mirror that is tiltable in two non-parallel axes. The point of intersection of these two non-parallel tilt axes is referred to as the pivot point of the 2-D scanning mirror. The 2-D scanning mirror is arranged in such a way that the pivot point thereof lies at a focal point of the first lens-element group. Therefore, rays that start from the center of the 2-D scanning mirror will extend parallel to the optical axis in a region between the first lens-element group and the second lens-element group 11. These rays are deflected by the second lens-element group 11 and imaged onto the pupil 21 of the focusing unit 13. As a result, the pivot point of the 2-D scanning mirror is imaged into the pupil 21 of the focusing unit 13.

It is a fundamental property of the present invention that this imaging of the pivot point of the 2-D scanning mirror into the pupil 21 of the focusing unit 13 is also achieved if the focusing unit 13 is moved.

The elements of the focusing unit 13 must be selected to be sufficiently large so that the light beams that start from the 2-D scanning mirror are not subject to vignetting. An important condition emerges for the diameter $D_{pupil}$ of the pupil 21 of the focusing unit 13. If $D_{WFM}$ denotes the diameter of the circular region of the wavefront manipulator 5 which is illuminated by the illumination light, and $f_1$ and $f_2$ respectively denote the focal lengths of the first lens-element group 9 and the second lens-element group 11, then the variables must be selected in such a way that the relationship $$\frac{f_1}{f_2} = \frac{D_{WFM}}{D_{pupil}}$$

is satisfied.

In this exemplary embodiment, the wavefront manipulator 5 is embodied as a transmissive element and directly arranged on the side of the 2-D scanning mirror that is further away from the sample 17. Such transmissive wavefront manipulators 5 are commercially available, as standard optical elements, as spatial light field modulators that are based on liquid crystals.

Accordingly, the beam path extends through the optical system 1 as outlined below. Illumination light from a light source is reflected by a beam splitter 23, passes through the wavefront manipulator 5, is reflected by a 2-D scanning mirror 7 and imaged by the first lens-element group 9 and the second lens-element group 11 into the pupil 21 of the imaging lens 15, which ultimately produces a focus in the sample 17 at a depth of z=3.175 mm.

The optical system 1 shown in FIG. 1 produces a focus with a good quality in relation to a spherical reference wavefront at a depth of 3.175 mm below the plane side of the sample that faces the focusing unit 13. Thus, the imaging lens is designed in such a way that it images, virtually without aberrations, a sample point at a depth of 3.175 mm to infinity. Therefore, in this case, the wavefront manipulator 5 is near its neutral state and only has a small influence on the form of the wavefronts. If a different focal position at a different distance from the plane surface of the sample 17 is set by moving the focusing unit 13, the wavefront manipulator 5 will correct the wavefront in such a way that, here too, the RMS wavefront error is less than 100 mλ, preferably less than 20 mλ. As a result, the wavefront manipulator is no longer in a neutral state.

A small object that is embedded within the sample 17 serves by way of scattering or fluorescence effects as a secondary light source and transmits part of the illumination light back in the direction of the microscope. This observation light passes through the optical system 1 along the reverse path, i.e. from the sample 17 in the direction of the wavefront manipulator 5. Therefore, the imaging lens 15, the second lens-element group 11, the first lens-element group 9 and the wavefront manipulator 5 are passed through twice. Some of the observation light is supplied to an observation unit 25 at a beam splitter 23, which is designed in such a way that the observation light is at least partly transmitted through the beam splitter surface. In the present exemplary embodiment, a further lens-element group, which produces an intermediate image, follows. A pinhole can be attached at the position of the intermediate image and it may be followed by a light-detecting unit, for example in the form of a photodiode, an image sensor, an eyepiece and/or another detection apparatus.

FIG. 2 shows, in a magnified fashion, the part of the optical system 1 which comprises the imaging lens 15 and the sample 17. Rays of three different light beams, which belong to different scanning angles of the 2-D scanning mirror 7, form different focal points at the same depth within the sample 17. The position of the pupil plane 21 is shown along the continuation of the rays that are incident into the imaging lens. It can be identified that the pupil plane 21 in this example lies within the interior of the first lens element of the imaging lens 15.

The focal position along the optical axis, i.e. the depth of the focus within the sample 17, can be selected by moving the focusing unit 15. Here, the focusing unit 15 is displaced along the optical axis. Only the focusing unit 15 has a movable arrangement. All other components of the optical system 1 can remain at a fixed position parallel to the optical axis. In particular, the sample and the first lens-element group 9 need not be moved parallel to the optical axis. However, the sample 17 with the sample stage can still be displaced laterally. Advantageously, in this case, neither does the sample 17 with the sample stage need to be moved parallel to the optical axis and nor does the spatially largest part of the apparatus into which the optical system 1 is installed need to be moved at all.

FIG. 3 shows the position of the focusing unit 13 for different focal positions along the optical axis of the optical system 1. Five focal positions in the range from z=0 mm to z=6.35 mm are represented. Associated with each focal position is a specific setting of the wavefront manipulator 5 such that the RMS wavefront error is minimized to the greatest possible extent. An optical path difference (OPD) is introduced by the geometric displacement of the focusing unit 13. Since the system is designed for a focal position of z=3.75 mm, the OPD is very small there for all considered rays. This can be identified in the diagrams in the left-hand column of FIG. 4, where the OPD introduced by the wavefront manipulator 5 is plotted depending on the ray position relative to the chief ray of the illumination light. The right-hand column of FIG. 4 plots the obtained RMS wavefront error after correction by the wavefront manipulator 5 against the lateral focus position.

It can be seen that the highest focus quality is obtained by an RMS value of less than 20 mλ for a lateral distance of the foci from the optical axis of 100 µm for focal positions of 0 mm<z<6.35 mm. This corresponds to a depth of field range of 2600 $d_R$. If a quality of the foci with RMS wavefront errors of less than 100 mλ is sufficient for the application, the lateral distance of the foci from the optical axis can even be greater than 140 µm. Since the second lens-element group and the imaging lens have a fixed distance from one another, the focus of the second lens-element group remains independent of the displacement of the focusing unit in the pupil plane of the imaging lens. Hence, the scanning unit is imaged into the pupil plane of the imaging lens for all positions of the focusing group.

FIG. 5 illustrates a second embodiment of the present invention. It differs from the first embodiment only in that the wavefront manipulator 105 is embodied here as an adaptive deformable mirror (DFM). The possible focal positions and the respective focus quality cannot be distinguished from those of the first embodiment. The DFM is tilted and bends the optical axis of the optical system 101. Depending on the construction, the geometric surface of the DFM can be circular or rectangular. The footprint of the light on the DFM is, however, elliptical in the case of a circular illumination on a tilted DFM 105. The surface of the DFM 105 can be deformed in order to change the OPD of the light beam, and hence the wavefront at the focus. Since the deformable mirror 105 is tilted against the optical axis by 45°, the required deformations are also no longer rotationally symmetric in relation to the center of the footprint.

FIG. 6 shows a third embodiment of the present invention in a schematic illustration. Here, the object of the apparatus is merely to produce foci within a sample. Therefore, an observation device is not required here. Advantageously, such a configuration can be used e.g. in so-called 3-D printers.

A laser beam is produced in a light source and reflected by a 2-D scanning unit. These are positioned on the left-hand side of FIG. 6, but not plotted in the figure. The scanning unit may consist of two 1-D scanning mirrors or two acousto-optic deflectors (AOD) in order to guide the beam in two dimensions. If use is made of two 1-D scanning devices, the pivot points of both 1-D scanning devices can be imaged on one another with the aid of a relay system such as, e.g. a Kepler system or an Offner relay.

In addition to the scanning unit, the optical system 201 in this embodiment consists of a first lens-element group 209 comprising at least one lens element, a second lens-element group 211 comprising at least one lens element, a transmissive wavefront manipulator 205 and a telecentric imaging lens 215. The imaging lens 215 comprises an accessible pupil plane 221. The transmissive wavefront manipulator 205 is arranged near to, or in, the pupil plane 221 of the imaging lens 215. The stop 219 is arranged directly on the wavefront manipulator 205. It therefore delimits the aperture beam and defines the position of the pupil plane 221. The second lens-element group 211, the wavefront manipulator 205 and the imaging lens 215 are arranged such that they can be moved together along the optical axis of the optical system 201. Hence, together, the imaging lens 215, the second lens-element group 211 and the wavefront manipulator 205 form a focusing unit 213. A pivot point of the scanning unit, which is arranged in the focal plane of the first lens-element group 209, is therefore imaged onto a point in the pupil plane 221 of the imaging lens 213 and hence onto the wavefront modulator 205. This is even the case if the focusing unit 213 is displaced along the optical axis. A focal position within the sample 217 can be adjusted by moving the focusing unit 213. Foci of the highest quality can be produced at different focal positions within the sample 217 by correcting the wavefront by use of the wavefront manipulator 205.

FIG. 7 shows a fourth embodiment of the present invention in a schematic illustration. By way of example, such an apparatus is suitable for producing foci within a sample 317. In this case, the sample 317 is a photomask for photolithography. By irradiating the transparent material of the mask with a pulsed laser, it is possible to irreversibly change the transparent material. The transparent material of the photolithographic mask is often fused silica. The introduction of a plurality of asymmetrical pixels into the transparent substrate causes a locally varying displacement of pattern elements which are arranged on the surface of the transparent substrate. As a result, the so-called registration of the mask can be corrected locally. Moreover, the writing of pixels into a transparent substrate leads to a second effect on the substrate since the pixels locally modify the optical transmission of the transparent substrate. As a result, the imaging of the critical dimension of the mask structures (CD) can be corrected. It is also possible to carry out both corrections together. The optical data for the optical system 301 are summarized in Table 2. Here, the materials NBK7, NSF5, NLASF44, NPK51 and NKZFS4 are commercially available glasses from Schott and SNBH51 is a glass from Ohara, the refractive indices of said glasses being known to a person skilled in the art. Moreover, these glass catalogues are stored in commercially available optical design programs, such as e.g. Code V or OSLO.

TABLE 2

| NA | 0.4 |
|---|---|
| Refractive index of the sample | 1.461 |
| Wavelength | 532 |

| Surface | Radius [mm] | Thickness [mm] | Material | Refractive index | Half-diameter [mm] |
|---|---|---|---|---|---|
| 0 | 0 | 2.1 | | | |
| 1 | 0 | 8 | AOD | | |
| 2 | 0 | 4.2 | | | |
| 3 | 0 | 8 | AOD | | |
| 4 | 0 | 0 | | | |
| 5 | 0 | 19.104092 | | | |
| 6 | 15.37 | 2.3 | NBK7 | | 2.8 |
| 7 | −11.16 | 0.9 | NSF5 | | 2.8 |
| 8 | −32.17 | 23.451145 | | | 2.8 |
| 9 | 0 | 120.912752 | | | |
| 10 | 162.43 | 2.4 | NSF5 | | 12 |
| 11 | 54.55 | 6 | NBK7 | | 12 |
| 12 | −76.28 | 25 | | | 11.75 |
| 13 | 0 | 16.453077 | | | |
| 14 | 0 | 25 | | | |
| 15 | 0 | 12.5 | NBK7 | | |
| 16 | 0 | 12.5 | NBK7 | | |
| 17 | 0 | 34.332277 | | | |
| 18 | 0 | 2 | Q1 | 1.4606853659 | 7.5 |
| 19 | 0 | 5 | | | 7.5 |
| 20 | 0 | 5 | | | |
| 21 | 0 | 2 | Q1 | 1.4606853659 | 7.5 |
| 22 | 0 | 34.332277 | | | 7.5 |
| 23 | 0 | 25 | NBK7 | | 12.5 |
| 24 | 0 | 30 | | | 12.5 |
| 25 | 0 | 61.571946 | | | 17.67767 |
| 26 | 91.37 | 5.7 | NBK7 | | 11.75 |
| 27 | −66.21 | 2.2 | NSF5 | | 12 |
| 28 | −197.71 | 146.130505 | | | 12 |
| 29 | 0 | 30 | | | |
| 30 | 0 | 27.465187 | | | 9.899495 |
| 31 | 76.36 | 2 | NSF5 | | 7 |
| 32 | 26.69 | 3.5 | NBK7 | | 7 |
| 33 | −37.23 | 5 | | | 7 |
| 34 | 0 | 15 | NBK7 | | |
| 35 | 0 | 35 | | | |
| 36 | 0 | 2 | Q1 | 1.4606853659 | 7.5 |
| 37 | 0 | 6.048125 | | | 7.5 |
| 38 | −5.4646 | 5.88 | NLASF44 | | 3.4 |
| 39 | −8.059 | 2.024 | | | 4.9 |
| 40 | −36.9157 | 1.18 | SNBH51 | | 4.75 |
| 41 | 10.366 | 5.5 | NPK51 | | 4.9 |
| 42 | −6.1313 | 1.2 | NKZFS4 | | 5.15 |
| 43 | −17.6655 | 2.7114 | | | 5.7 |
| 44 | 20.9822 | 3 | NPK51 | | 6.2 |
| 45 | −20.9822 | 0.283 | | | 6.2 |
| 46 | 10.984 | 3.95 | SNBH51 | | 5.675 |
| 47 | 15.732 | 6.4026 | | | 4.58 |

| Surface | Decentring Δx | and tilt Δy | Δz | Alpha [°] | Beta [°] |
|---|---|---|---|---|---|
| 16 | 0 | 0 | 0 | 45 | 0 |
| 20 | 0 | 0 | 0 | −90 | 0 |
| 25 | 0 | 0 | 0 | 45 | 0 |
| 30 | 0 | 0 | 0 | 45 | 0 |

It is known that not only pixels that are as punctiform as possible but also asymmetric pixels with an elongate extent are useful for correcting the registration of photolithographic masks. Such a pixel form can be produced by astigmatic foci. Thus, in this case, the reference wavefront is not spherical but has a predetermined astigmatic distortion. The production of the astigmatic foci can be produced by the wavefront manipulator 305. Expediently, the required wavefront modification can be described by two-dimensional basis functions such as, e.g. the Zernike polynomials in the so-called fringe normalization. The axis of the astigmatic focal points, i.e. the position thereof in space, can be predetermined by a suitably predetermined wavefront that is set by the wavefront manipulator. This is advantageous in that an alignment of the foci is possible without movable optical components.

The optical system 301 in the fourth embodiment comprises the focusing unit 313, which is designed to focus rays onto a focus, with the focusing unit 313 being arranged in a movable manner along an optical axis of the optical system 301 such that the focal position along the optical axis of the optical system 301 can be changed. Here, the focusing unit 313 comprises a pupil plane 321. The latter emerges as an image of a stop 319. Further, the optical system 301 comprises a wavefront manipulator 305, which is designed in such a way that the RMS of the wavefront error is less than 100 mλ, preferably less than 20 mλ, in at least two focal positions of the focusing unit 313 that differ from one another. In this embodiment, the stop 319 is located on, or just upstream of, the wavefront manipulator 305. The wavefront manipulator 305 and the pupil plane 321 of the imaging lens 313 are positioned relative to one another in such a way that rays that impinge on the same point of the wavefront manipulator 305 impinge on a common point in the pupil plane 321 in the at least two focal positions that differ from one another.

The optical system 301 further comprises a first lens-element group 309. The focusing unit 313 comprises a second lens-element group 311 and imaging lens 315, with the focus of the second lens-element group 311 lying in the pupil plane 321 of the imaging lens 315.

The illumination is brought about by a pulsed laser. The illumination light is linearly polarized. The laser beam having, e.g. a beam diameter of 3 mm passes through a 2-D scanning unit 307. The scanning unit 307 consists of two acousto-optic deflectors (AOD) in order to guide the beam in two dimensions. The axes of the two AODs, in which the light is deflected, are perpendicular to one another. The achievable scanning angle depends on the ultrasonic frequency applied to the respective AOD. The maximum scanning angle of the AODs is restricted to approximately 1°. A Kepler system made of two lens elements having a focal length of f=25 mm and f=125 mm, respectively, images a point between the AODs onto a wavefront sensor. The Kepler system also increases the diameter of the collimated illumination light by a factor of 5, from 3 mm to 15 mm.

Between the Kepler system and the first lens-element group 309, there is a polarization beam splitter (PBS) 323*a* and a λ/4-plate 329, the axis of which is rotated by 45° against the direction of the linear polarization of the illumination light. The polarization of the illumination beam is selected, and the polarization beam splitter 323*a* is designed, in such a way that the incoming beam is reflected by the PBS 323*a*. After the first passage, the λ/4-plate 329 converts the linearly polarized light into circularly polarized light. Then, the light is incident on the wavefront manipulator 305, which is embodied as a deformable mirror 305. After the reflection at the deformable mirror 305, the light passes through the λ/4-plate 329 a further time and is converted back into linearly polarized light. The direction of the polarization is now perpendicular to the original polarization direction, and so the light now passes the polarization beam splitter 323*a* in transmission. For example, mirrors 331 can be provided to redirect the light.

The DFM 305 is arranged in a focal plane of the first lens-element group 309. The focus of the second lens-element group 311 lies in the pupil plane 321 of the imaging lens 315. The pupil plane 321 of the imaging lens 315 is inaccessible. This means that the wavefront manipulator 305 is arranged in a conjugate plane of the pupil of the imaging lens 315. Thus, a change in the surface form of the DFM 305 causes double the change of the optical wavelength (OPD) and hence also of the wavefront. Since the second lens-element group and the imaging lens have a fixed distance from one another, the focus of the second lens-element group remains independent of the displacement of the focusing unit in the pupil plane of the imaging lens. Hence, the wavefront manipulator is imaged into the pupil plane of the imaging lens for all positions of the focusing group.

A further beam splitter 323*b* is arranged in the beam path between the second lens-element group 311 and the imaging lens 315. The beam splitter 323*b* is designed in such a way that some of the illumination light is reflected by the beam splitter surface and some of the illumination light is supplied to an observation unit 325. A predetermined portion of the illumination light can be supplied to the observation unit 325 by way of a suitable design of the beam splitter layer. Often, only a small part is selected, for example 1%, 5% or 10%. In this exemplary embodiment, this observation device 325 is embodied as a wavefront sensor 327 for detecting the wavefront that was set by the wavefront manipulator 305. The wavefront sensor 327 is used to measure the wavefront in the pupil plane 321 of the imaging lens 313. The inlet window of the wavefront sensor 327 is arranged in the focal plane of the second lens-element group 311. The wavefront sensor 327 measures data that are suitable for characterizing the wavefront. A control unit (not depicted here) processes the data recorded by the wavefront sensor 327. This processing comprises the following steps: comparing with a reference wavefront, calculating a correction wavefront from this comparison, setting new control signals for the wavefront manipulator 305 from the correction wavefront and transmitting the control signals to the wavefront manipulator 305. After the wavefront has been corrected, the wavefront can be measured again and a new and refined correction can be determined. A control loop is thus set up.

The imaging lens 315, the observation device 325 and the second lens-element group 311 are arranged together on a platform which is movable parallel to the optical axis of the optical system. This forms a focusing unit 313 which comprises the imaging lens 315, the observation device 325 and the second lens-element group 311. The sample 317 to be examined is likewise illustrated and has a plane surface on the side facing the imaging lens 315. By moving the focusing unit 313 parallel to the optical axis of the optical system 301, it is possible to change the focal position 335 within the sample 317, likewise in a manner parallel to the optical axis.

Optionally, the focusing unit 313 may comprise further elements. It may be necessary to attach further λ/2-plates or λ/4-plates, deflection mirrors for meeting installation space restrictions or optical filters. λ/4- or λ/2-plates can also have a relatively large retardation. Since a retardation of a multiple of the wavelength has no effect on the polarization-optical properties within the scope of a perpendicular passage, it is also possible to commercially obtain higher-order elements. Here, the order is specified by integer multiples of the wavelength. Higher-order wave-plates are advantageous in that they are less sensitive to damage and are able to be produced more cost-effectively. The disadvantage thereof lies in a higher angle dependence of the polarization-optical effect.

In this embodiment, the imaging lens 315 has a telecentric embodiment on the sample side. Therefore, focal positions which are situated at the same distance from the plane side of the sample 317 that faces the imaging lens 315 but which have different lateral positions have virtually the same wavefront error. Therefore, the necessary correction wavefront, which needs to be set by the wavefront manipulator 305, substantially only depends on the position of the focusing unit 313 parallel to the optical axis of the optical system. This is advantageous in that the wavefront correction need not be changed during the lateral scanning by way of the scanning unit. As a result, it is possible to obtain a more efficient, more stable and faster correction method for photolithographic masks.

The lateral extent of the photomask is large in comparison with the lateral displacement of the focal positions which can be achieved by the scanning unit 307. In order to produce foci at any position within the transparent material of the photomask, the photomask is applied to a lateral positioning unit (not shown here). This enables fast and accurate lateral positioning of the mask 317. It is also possible to carry out corrections of the photomask while the sample is moved laterally by the positioning unit. This means that the sample has a speed relative to the optical system v≠0 m/s while the foci are produced at different focal positions in the transparent material. Less time is required to correct a photomask 317 as a result of this writing of the pixels during the movement.

FIG. 8 shows a fifth embodiment of the present invention in a schematic illustration. Such an apparatus in accordance with the fifth embodiment is suitable for producing foci within a sample. In this case, the sample is a photomask 417 for photolithography. The apparatus can be used to correct masks for photolithography by way of irreversible changes in the transparent material of a photomask. The illumination is brought about by a pulsed laser. The illumination light is linearly polarized. The basic structure is similar to the structure of the fourth embodiment.

The optical system 401 in the fifth embodiment comprises a focusing unit 413, which is designed to focus rays onto a focus 435, with the focusing unit 413 being arranged in a movable manner along an optical axis of the optical system 401 such that the focal position along the optical axis of the optical system 401 can be changed. Here, the focusing unit 413 comprises a pupil plane 421. The latter emerges as an image of a stop 419. Further, the optical system 401 comprises a wavefront manipulator 405, which is designed in such a way that the RMS of the wavefront error is less than 100 mλ, preferably less than 20 mλ, in at least two focal positions of the focusing unit 413 that differ from one another. In this embodiment, the stop 419 is located on, or just upstream of, the wavefront manipulator 405. The wavefront manipulator 405 and the pupil plane 421 of the imaging lens 413 are positioned relative to one another in such a way that rays that impinge on the same point of the wavefront manipulator 405 impinge on a common point in the pupil plane 421 in the at least two focal positions that differ from one another.

The optical system 401 further comprises a first lens-element group 409. The focusing unit 413 comprises a second lens-element group 411 and imaging lens 415, with the focus of the second lens-element group 411 lying in the pupil plane 421 of the imaging lens 415. For example, mirrors 431 can be provided to redirect light between the first lens-element group 409 and the second lens-element group 411. Since the second lens-element group and the imaging lens have a fixed distance from one another, the focus of the second lens-element group remains independent of the displacement of the focusing unit in the pupil plane of the imaging lens. Hence, the wavefront manipulator is imaged into the pupil plane of the imaging lens for all positions of the focusing group.

The illumination is brought about by a pulsed laser. The illumination light is linearly polarized. The laser beam having e.g. a beam diameter of 3 mm passes through a 2-D scanning unit 407. The scanning unit 407 consists of two acousto-optic deflectors (AOD) in order to guide the beam in two dimensions. The axes of the two AODs, in which the light is deflected, are perpendicular to one another. Two further lens-element groups, which form a Kepler system, are arranged between the 2-D scanning unit and the wavefront manipulator 405. In the present exemplary embodiment, they have focal lengths of 60 mm and 150 mm. They serve to image the pivot points of the scanning unit 407 onto the wavefront manipulator 405. In this example, the stop 419 is arranged on, or near to, the wavefront manipulator 405. The pupil plane 421 of the imaging lens 413 is set by the image of this stop.

In addition to the first observation unit 425a which, as described in the fourth exemplary embodiment, is arranged between the second lens-element group 411 and the imaging lens 415, this embodiment comprises a further observation unit 425b. A dichroic beam splitter 423 is arranged in the beam path, which is designed in such a way that the observation light is reflected by the beam splitter surface and some of the observation light is supplied to a further observation unit 425b. Here, this further observation unit 425b is embodied as an image sensor 433 with lens elements disposed upstream thereof. The dichroic beam splitter 423 is designed in such a way that it transmits light with a wavelength of 532 nm and reflects light with a wavelength of 455 nm±10 nm. Therefore, a further light source is required to operate this further observation device 425b. The pulsed laser with a wavelength of 532 nm is used to process the photomask by writing pixels; the further light source with a wavelength of 455 nm±10 nm is used to operate the further observation device 425b. This further light source is not shown in FIG. 8. The further light source can be arranged above, below or next to the sample 417. The image sensor 433 of the further observation device 425b can be used to monitor the precise position of a lateral positioning unit and/or to use position data of the positioning unit in a control loop for controlling the positioning unit. Furthermore, the image of the image sensor 433 can be used to observe the processing of the transparent material of the photomask 417. The images can be used for visual control of the correction of the mask, and hence for ensuring the correction quality.

In the diagrams of the left-hand column, FIG. 9 shows the sag of the wavefront manipulator 405, which is embodied as a deformable mirror (DFM) in this case. The lateral, radial position on the deformable mirror is specified on the x-axis. Each individual diagram corresponds to a focal position parallel to the optical axis. Here, the depth of the focus as a distance from the plane surface of the sample 417 that faces the imaging lens 415 is measured. Diagrams are shown for focal positions at a depth of 0 mm, 2.5 mm, 5 mm, 7.5 mm and 10 mm. The sag of the wavefront manipulator 405 is shown on the y-axis of the diagrams. The achieved RMS wavefront errors after the correction by the wavefront manipulator 405 are plotted depending on the lateral focus position in the right-hand column of FIG. 9, for the same focal positions parallel to the optical axis (depths).

The optical system 401 of the fifth embodiment has a Rayleigh parameter of $d_R = 2.43$ μm. The depth of field range is approximately $4100 \cdot d_R$. An RMS wavefront error of less than 20 mλ is obtained for a lateral focal position of up to 120 mm. The RMS wavefront error exceeds a value of 20 mλ, but stays significantly below 100 mλ, for a lateral focal position of 120 μm to 180 μm or even more.

FIG. 10 shows a sixth embodiment of the present invention in a schematic illustration. The optical system 501 in the sixth embodiment comprises a focusing unit 513, which is designed to focus rays onto a focus 535 in or near a sample 517, with the focusing unit 513 being arranged in a movable manner along an optical axis of the optical system 501 such that the focal position along the optical axis of the optical system 501 can be changed. Here, the focusing unit 513 comprises a pupil plane 521. The latter emerges as an image of a stop 519. Further, the optical system 501 comprises a wavefront manipulator 505, which is designed in such a way that the RMS of the wavefront error is less than 100 mλ, preferably less than 20 mλ, in at least two focal positions of the focusing unit 513 that differ from one another. In this embodiment, the stop 519 is located on, or just upstream of, the wavefront manipulator 505. The wavefront manipulator 505 and the pupil plane 521 of the imaging lens 513 are positioned relative to one another in such a way that rays that impinge on the same point of the wavefront manipulator 505 impinge on a common point in the pupil plane 521 in the at least two focal positions that differ from one another. The optical system 501 further comprises a first lens-element group 509. The focusing unit 513 comprises a second lens-element group 511 and imaging lens 515, with the focus of the second lens-element group 511 lying in the pupil plane 521 of the imaging lens 515.

A scanning unit 507 comprises two AODs arranged in succession. The wavefront manipulator 505 is embodied as a deformable mirror. In contrast to the fourth embodiment and fifth embodiment of the invention, the mean angle of incidence of the light beam radiated onto the surface of the wavefront manipulator 505 by the light source significantly differs from 0°. This means that the surface normal of the wavefront manipulator 505 coincides neither with the optical axis of the optical system 501 prior to the reflection nor with the optical axis of the system after the reflection. This is advantageous in that there is no need to use either beam splitters or λ/4-plates. However, the advantage arising from the easier availability and manipulability of a deformable mirror is maintained.

A further polarization beam splitter 523 is arranged in the beam path between the second lens-element group 511 and the imaging lens 515. The polarization beam splitter 523 is designed in such a way that the observation light is reflected by the beam splitter surface and some of the observation light is supplied to an observation unit 525. In this exemplary embodiment, this observation device 525 is embodied as a wavefront sensor 527 for detecting the wavefront set by the wavefront manipulator 505.

The imaging lens 515, the observation device 525 and the second lens-element group 511 are arranged together on a platform which is movable parallel to the optical axis of the optical system 501. This forms a focusing unit 513 which comprises the imaging lens 515, the observation device 525 and the second lens-element group 511.

In this embodiment, the second lens-element group 511 is embodied with a focal length of $f_2$=60 mm.

FIG. 11 shows a seventh embodiment of the present invention in a schematic illustration. This embodiment is very similar to the sixth embodiment. Here, the mean angle of incidence of the light incident on the wavefront manipulator 605 from the light source deviates only slightly from 0°. For example, the optical system 601 in the seventh embodiment can include a scanning unit 607, a first lens-element group 609, a second lens-element group 611, and a focusing unit 613, which includes imaging lens 615 and is designed to focus rays onto a focus 635 in or near a sample 617. The optical system 601 includes a stop 619 and defines a pupil plane 621. The optical system 601 includes a polarization beam splitter 623 and an observation device 625 which can include a wavefront sensor 627.

It is expedient to keep the tilt angle of the surface normal of the wavefront manipulator 605 in relation to the optical axis of the optical system 601 as small as possible. As a result, the maximum occurring angles of incidence on the wavefront manipulator 605 are likewise kept small. This renders it easier to obtain a uniform reflectivity for all rays. Moreover, the deformable mirror then causes smaller aberrations in the case of large lateral focal positions.

In addition to the advantages of the sixth embodiment, some lens elements are saved since some lens elements are additionally passed through twice.

FIG. 12 shows an eighth embodiment of the present invention in a schematic illustration. The optical system 701 from the eighth embodiment comprises a first lens-element group 709 comprising at least one first lens element and a focusing unit 713, wherein the focusing unit 713 comprises a second lens-element group 711 comprising at least one second lens element and an imaging lens 715, wherein the imaging lens 715 has at least one pupil plane 721 and a focus 735, wherein the focusing unit 713 is movably arranged along an optical axis of the optical system 701 in such a way that the focal position along the optical axis of the optical system can be changed. The focus of the second lens-element group 711 lies in the pupil plane 721 of the imaging lens 715. Further, the optical system 701 comprises a wavefront manipulator 705, which is designed in such a way that the RMS of the wavefront error is less than 100 mλ, preferably less than 20 mλ, in at least two focal positions of the imaging lens 715 that differ from one another. For example, the optical system 701 can include a stop 719, beam splitters 723, an observation device 725, a wavefront sensor 727, a λ/4-plate 729, and a mirror 731.

In this embodiment, the wavefront manipulator 705 is embodied as a deformable mirror. The wavefront manipulator 705 is arranged in the focal plane of the first lens-element group 709 and is imaged into the pupil 721 of the imaging lens 715 by the second lens-element group 711. Since the pupil 721 of the imaging lens 715 lies in the focal plane of the second lens-element group 711, the wavefront manipulator 705 is imaged into the pupil. This imaging is independent of the position of the focusing unit 713.

A point in the vicinity of the pivot point of the 2-D scanning unit 707 is imaged into the center of the pupil. The scanning unit 707 deflects the laser beam in such a way that the angle between the laser beam and the optical axis is adjustable in a range of between 0° and 2.5°. This corresponds to an angle range of between 0° and 1.25° in the pupil of the imaging lens 715. The focal length of the imaging lens 715 is 3.29 mm. Therefore, the lateral focal positions are described by a circle with a diameter of 2·3.29 mm·tan (1.25°)≈144 µm.

The numerical aperture in the sample 717 is NA=0.6. The sample is water with a refractive index of n=1.335; the wavelength of the light source is 532 nm. Hence, the Rayleigh length is $d_R=(\lambda \cdot n)/(2 \cdot NA^2)$=0.986 µm.

The lateral focal positions in the sample can be set in a depth range of 0<z<5280 µm parallel to the optical axis of the optical system 701. This corresponds to a depth range of 5350·$d_R$.

FIG. 13 shows the sag of the deformable mirror 705 and the focal quality as RMS wavefront error. It is possible to recognize that, over the entire range, which comprises lateral focal positions up to 72 µm and a depth range up to 5350·$d_R$, the quality of the foci with an RMS wavefront error of less than 100 mλ is high. If a worse focus quality suffices for an application, it is possible to select a greater extent of the lateral focus positions.

What is claimed is:

1. An optical system, comprising
a first lens-element group comprising at least a first lens element,
a focusing unit which is designed to focus beams onto a focus,
   wherein the focusing unit is movably arranged along an optical axis of the optical system in such a way that a focal position can be changed along the optical axis of the optical system,
   wherein the focusing unit comprises a second lens-element group comprising at least a second lens element and
an imaging lens,
   wherein the imaging lens further comprises a pupil plane, a scanning unit which is designed in such a way that the focus can be displaced laterally in relation to the optical axis, a wavefront manipulator,
which is designed in such a way that a root-mean-square (RMS) wavefront error is less than 100 m$\lambda$, in at least two focal positions of the focusing unit that differ from one another,
wherein the wavefront manipulator is arranged in the pupil plane of the imaging lens or in a plane that is conjugate to the pupil plane of the imaging lens,
or the scanning unit is arranged in a plane that is conjugate to the pupil plane of the imaging lens and the wavefront manipulator is arranged upstream of the scanning unit in a light direction, wherein a focus of the second lens-element group lies in the pupil plane of the imaging lens in both focal positions of the focusing unit.

2. The optical system according to claim 1, comprising a focusing range of more than 500 Rayleigh lengths.

3. The optical system according to claim 1, wherein the scanning unit is embodied as tiltable mirror.

4. The optical system according to claim 1, wherein the scanning unit comprises two acousto-optic deflectors, which change the focal position in mutually perpendicular directions.

5. The optical system according to claim 1, wherein the wavefront manipulator is positioned in a focus of the first lens-element group.

6. The optical system according to claim 1, wherein the scanning unit is positioned in a focus of the first lens-element group.

7. The optical system according to claim 1, wherein the wavefront manipulator is designed as a deformable mirror.

8. The optical system according to claim 1, wherein the focusing unit is designed in such a way that a point of a sample is imaged into an image point in an image plane.

9. The optical system according to claim 1, wherein the optical system is telecentric on a sample side.

10. The optical system according to claim 1, wherein a light source produces illumination light and a beam splitter is arranged in the optical system in such a way that some of the illumination light is supplied to an observation device.

11. The optical system according to claim 10, wherein the observation device is embodied as a wavefront sensor in order to detect a wavefront that was set by the wavefront manipulator.

12. The optical system according to claim 11, comprising a control unit which compares data that were recorded by the wavefront sensor with a reference wavefront and transfers corrections that were calculated from deviations of a measured wavefront from the reference wavefront to the wavefront manipulator.

13. The optical system according to claim 10, wherein the system comprises a light source that is a pulsed laser.

14. A method for correcting defects of a photolithographic mask, said method comprising:
providing an optical system according to claim 1,
focusing a first focal position within the photolithographic mask using the focusing unit along an optical axis of the system,
setting a wavefront by use of a wavefront manipulator such that the RMS wavefront error is less than 100 m$\lambda$,
correcting a first fault of the mask by introducing a first irreversible change at the first focal position within the photolithographic mask.

15. The method for correcting defects of a photolithographic mask according to claim 14, wherein the method comprises:
focusing a second focal position within the photolithographic mask using the focusing unit along an optical axis of the system,
setting a wavefront by use of a wavefront manipulator such that the RMS wavefront error is less than 100 m$\lambda$, and
correcting a second fault of the mask by introducing a second irreversible change at the second focal position within the photolithographic mask.

16. The method for correcting defects of a photolithographic mask according to claim 14, wherein the method further comprises the step of laterally scanning the focal position over a portion of the photolithographic mask.

17. The method for correcting defects of a photolithographic mask according claim 15, wherein the method comprises measuring a wavefront using a wavefront sensor.

18. The method for correcting defects of a photolithographic mask according to claim 17, wherein the method comprises the following steps:
comparing the measured wavefront with a reference wavefront,
calculating a correction wavefront from this comparison such that the RMS wavefront error is reduced,
setting new control signals for the wavefront manipulator from the correction wavefront, and
transmitting the control signals to the wavefront manipulator.

19. The method of claim 15 in which setting the wavefront by use of the wavefront manipulator comprises setting the wavefront by use of a deformable mirror.

20. The method of claim 16 in which laterally scanning the focal position comprises using at least one of (i) at least one tiltable mirror, or (ii) at least one acousto-optic deflector, to scan the focal position over the portion of the photolithographic mask.

* * * * *

UNITED STATES PATENT AND TRADEMARK OFFICE
CERTIFICATE OF CORRECTION

| | |
|---|---|
| PATENT NO. | : 11,249,294 B2 |
| APPLICATION NO. | : 16/269771 |
| DATED | : February 15, 2022 |
| INVENTOR(S) | : Markus Seesselberg et al. |

It is certified that error appears in the above-identified patent and that said Letters Patent is hereby corrected as shown below:

In the Specification

Column 21
Line 50, delete "625" and insert -- 625, --

In the Claims

Column 24
Line 31, in Claim 17, after "according" insert -- to --

Signed and Sealed this
Thirtieth Day of May, 2023

Katherine Kelly Vidal
*Director of the United States Patent and Trademark Office*